(12) United States Patent
Visser et al.

(10) Patent No.: US 9,362,530 B2
(45) Date of Patent: *Jun. 7, 2016

(54) ENCAPSULATED WHITE OLEDS HAVING ENHANCED OPTICAL OUTPUT

(71) Applicant: Samsung Display Co., Ltd., Yongin (KR)

(72) Inventors: Robert Jan Visser, Menlo Park, CA (US); Lorenza Moro, San Carlos, CA (US)

(73) Assignee: Samsung Display Co., Ltd., Yongin (KR)

(*) Notice: Subject to any disclaimer, the term of this patent is extended or adjusted under 35 U.S.C. 154(b) by 0 days.

This patent is subject to a terminal disclaimer.

(21) Appl. No.: 14/797,260

(22) Filed: Jul. 13, 2015

(65) Prior Publication Data

US 2016/0013450 A1 Jan. 14, 2016

Related U.S. Application Data

(63) Continuation of application No. 12/341,251, filed on Dec. 22, 2008, now Pat. No. 9,184,410.

(51) Int. Cl.
*H01L 51/52* (2006.01)
*H01L 51/50* (2006.01)

(52) U.S. Cl.
CPC ........ *H01L 51/5275* (2013.01); *H01L 51/5206* (2013.01); *H01L 51/5234* (2013.01); *H01L 51/5237* (2013.01); *H01L 51/5256* (2013.01); *H01L 51/5262* (2013.01);
(Continued)

(58) Field of Classification Search
CPC ............ H01L 51/5275; H01L 51/5206; H01L 51/5234; H01L 51/5256; H01L 2551/301; H01L 2551/5361; H01L 2551/558
See application file for complete search history.

(56) References Cited

U.S. PATENT DOCUMENTS

| 2,382,432 A | 8/1945 | McManus et al. |
| 2,384,500 A | 9/1945 | Stoll |

(Continued)

FOREIGN PATENT DOCUMENTS

| BE | 704297 | 2/1968 |
| CA | 2 353 506 | 5/2000 |

(Continued)

OTHER PUBLICATIONS

De Gryse, R. et al., "Sputtered Transparent Barrier Layers," Tenth International Conference on Vacuum Web Coating (Edited by R. Bakish) aka the 10$^{th}$ Bakish Conference; 1996; pp. 190-198.

(Continued)

*Primary Examiner* — Mark Ellen Bowman
(74) *Attorney, Agent, or Firm* — Dinsmore & Shohl LLP

(57) ABSTRACT

Methods of making an integrated barrier stack and optical enhancement layer for protecting and improving the light out coupling of encapsulated white OLEDs are described. The method includes optimizing the thickness of various layers including one or more of the plasma protective layer, the initial organic layer, the initial inorganic barrier layer, and the inorganic barrier layer and polymeric decoupling layer for the barrier stack. The thickness is optimized for at least one of total efficiency, or intentional color point shift so that the encapsulated OLED has enhanced light outcoupling compared to the bare OLED.

9 Claims, 10 Drawing Sheets

(52) U.S. Cl.
CPC .......... *H01L 51/50* (2013.01); *H01L 2251/301* (2013.01); *H01L 2251/5361* (2013.01); *H01L 2251/558* (2013.01)

(56) References Cited

U.S. PATENT DOCUMENTS

| | | | |
|---|---|---|---|
| 3,475,307 A | 10/1969 | Knox et al. |
| 3,496,427 A | 2/1970 | Lee |
| 3,607,365 A | 9/1971 | Lindlof |
| 3,661,117 A | 5/1972 | Cornelius et al. |
| 4,061,835 A | 12/1977 | Poppe et al. |
| 4,098,965 A | 7/1978 | Kinsman |
| 4,266,223 A | 5/1981 | Frame |
| 4,283,482 A | 8/1981 | Hattori et al. |
| 4,313,254 A | 2/1982 | Feldman et al. |
| 4,426,275 A | 1/1984 | Meckel et al. |
| 4,521,458 A | 6/1985 | Nelson |
| 4,537,814 A | 8/1985 | Itoh et al. |
| 4,555,274 A | 11/1985 | Kitajima et al. |
| 4,557,978 A | 12/1985 | Mason |
| 4,572,845 A | 2/1986 | Christen |
| 4,581,337 A | 4/1986 | Frey et al. |
| 4,624,867 A | 11/1986 | Iijima et al. |
| 4,690,728 A | 9/1987 | Tsang et al. |
| 4,695,618 A | 9/1987 | Mowrer |
| 4,710,426 A | 12/1987 | Stephens |
| 4,722,515 A | 2/1988 | Ham |
| 4,768,666 A | 9/1988 | Kessler |
| 4,842,893 A | 6/1989 | Yializis et al. |
| 4,843,036 A | 6/1989 | Schmidt et al. |
| 4,855,186 A | 8/1989 | Grolig et al. |
| 4,889,609 A | 12/1989 | Cannella |
| 4,913,090 A | 4/1990 | Harada et al. |
| 4,931,158 A | 6/1990 | Bunshah et al. |
| 4,934,315 A | 6/1990 | Linnebach et al. |
| 4,954,371 A | 9/1990 | Yializis |
| 4,977,013 A | 12/1990 | Ritchie et al. |
| 5,032,461 A | 7/1991 | Shaw et al. |
| 5,036,249 A | 7/1991 | Pike-Biegunski et al. |
| 5,047,131 A | 9/1991 | Wolfe et al. |
| 5,059,861 A | 10/1991 | Littman et al. |
| 5,124,204 A | 6/1992 | Yamashita et al. |
| 5,189,405 A | 2/1993 | Yamashita et al. |
| 5,203,898 A | 4/1993 | Carpenter et al. |
| 5,204,314 A | 4/1993 | Kirlin et al. |
| 5,237,439 A | 8/1993 | Misono et al. |
| 5,260,095 A | 11/1993 | Affinito |
| 5,336,324 A | 8/1994 | Stall et al. |
| 5,344,501 A | 9/1994 | Hashimoto et al. |
| 5,354,497 A | 10/1994 | Fukuchi et al. |
| 5,356,947 A | 10/1994 | Ali et al. |
| 5,357,063 A | 10/1994 | House et al. |
| 5,376,467 A | 12/1994 | Abe et al. |
| 5,393,607 A | 2/1995 | Kawasaki et al. |
| 5,395,644 A | 3/1995 | Affinito |
| 5,402,314 A | 3/1995 | Amago et al. |
| 5,427,638 A | 6/1995 | Goetz et al. |
| 5,440,446 A | 8/1995 | Shaw et al. |
| 5,451,449 A | 9/1995 | Shetty et al. |
| 5,461,545 A | 10/1995 | Leroy et al. |
| 5,464,667 A | 11/1995 | Kohler et al. |
| 5,510,173 A | 4/1996 | Pass et al. |
| 5,512,320 A | 4/1996 | Turner et al. |
| 5,536,323 A | 7/1996 | Kirlin et al. |
| 5,547,508 A | 8/1996 | Affinito |
| 5,554,220 A | 9/1996 | Forrest et al. |
| 5,576,101 A | 11/1996 | Saitoh et al. |
| 5,607,789 A | 3/1997 | Treger et al. |
| 5,620,524 A | 4/1997 | Fan et al. |
| 5,629,389 A | 5/1997 | Roitman et al. |
| 5,652,192 A | 7/1997 | Matson et al. |
| 5,654,084 A | 8/1997 | Egert |
| 5,660,961 A | 8/1997 | Yu |
| 5,665,280 A | 9/1997 | Tropsha |
| 5,681,615 A | 10/1997 | Affinito et al. |
| 5,681,666 A | 10/1997 | Treger et al. |
| 5,684,084 A | 11/1997 | Lewin et al. |
| 5,686,360 A | 11/1997 | Harvey, III et al. |
| 5,693,956 A | 12/1997 | Shi et al. |
| 5,695,564 A | 12/1997 | Imahashi |
| 5,711,816 A | 1/1998 | Kirlin et al. |
| 5,725,909 A | 3/1998 | Shaw et al. |
| 5,731,661 A | 3/1998 | So et al. |
| 5,736,207 A | 4/1998 | Walther et al. |
| 5,747,182 A | 5/1998 | Friend et al. |
| 5,757,126 A | 5/1998 | Harvey, III et al. |
| 5,759,329 A | 6/1998 | Krause et al. |
| 5,771,177 A | 6/1998 | Tada et al. |
| 5,771,562 A | 6/1998 | Harvey, III et al. |
| 5,782,355 A | 7/1998 | Katagiri et al. |
| 5,792,550 A | 8/1998 | Phillips et al. |
| 5,795,399 A | 8/1998 | Hasegawa et al. |
| 5,811,177 A | 9/1998 | Shi et al. |
| 5,811,183 A | 9/1998 | Shaw et al. |
| 5,821,692 A | 10/1998 | Rogers et al. |
| 5,844,363 A | 12/1998 | Gu et al. |
| 5,861,658 A | 1/1999 | Cronin et al. |
| 5,869,791 A | 2/1999 | Young |
| 5,872,355 A | 2/1999 | Hueschen |
| 5,891,554 A | 4/1999 | Hosokawa et al. |
| 5,895,228 A | 4/1999 | Biebuyck et al. |
| 5,902,641 A | 5/1999 | Affinito et al. |
| 5,902,688 A | 5/1999 | Antoniadis et al. |
| 5,904,958 A | 5/1999 | Dick et al. |
| 5,912,069 A | 6/1999 | Yializis et al. |
| 5,919,328 A | 7/1999 | Tropsha et al. |
| 5,920,080 A | 7/1999 | Jones |
| 5,922,161 A | 7/1999 | Wu et al. |
| 5,929,562 A | 7/1999 | Pichler |
| 5,934,856 A | 8/1999 | Asakawa et al. |
| 5,945,174 A | 8/1999 | Shaw et al. |
| 5,948,552 A | 9/1999 | Antoniadis et al. |
| 5,952,778 A | 9/1999 | Haskal et al. |
| 5,955,161 A | 9/1999 | Tropsha |
| 5,965,907 A | 10/1999 | Huang et al. |
| 5,968,620 A | 10/1999 | Harvey et al. |
| 5,994,174 A | 11/1999 | Carey et al. |
| 5,996,498 A | 12/1999 | Lewis |
| 6,004,660 A | 12/1999 | Topolski et al. |
| 6,013,337 A | 1/2000 | Knors |
| 6,040,017 A | 3/2000 | Mikhael et al. |
| 6,045,864 A | 4/2000 | Lyons et al. |
| 6,066,826 A | 5/2000 | Yializis |
| 6,083,313 A | 7/2000 | Venkatraman et al. |
| 6,083,628 A | 7/2000 | Yializis |
| 6,084,702 A | 7/2000 | Byker et al. |
| 6,087,007 A | 7/2000 | Fujii et al. |
| 6,092,269 A | 7/2000 | Yializis et al. |
| 6,106,627 A | 8/2000 | Yializis |
| 6,117,266 A | 9/2000 | Horzel et al. |
| 6,118,218 A | 9/2000 | Yializis et al. |
| 6,146,225 A | 11/2000 | Sheats et al. |
| 6,146,462 A | 11/2000 | Yializis et al. |
| 6,150,187 A | 11/2000 | Zyung et al. |
| 6,165,566 A | 12/2000 | Tropsha |
| 6,178,082 B1 | 1/2001 | Farooq et al. |
| 6,195,142 B1 | 2/2001 | Gyotoku et al. |
| 6,198,217 B1 | 3/2001 | Suzuki et al. |
| 6,198,220 B1 | 3/2001 | Jones et al. |
| 6,203,898 B1 | 3/2001 | Kohler et al. |
| 6,207,238 B1 | 3/2001 | Affinito |
| 6,207,239 B1 | 3/2001 | Affinito |
| 6,214,422 B1 | 4/2001 | Yializis |
| 6,217,947 B1 | 4/2001 | Affinito |
| 6,224,948 B1 | 5/2001 | Affinito |
| 6,228,434 B1 | 5/2001 | Affinito |
| 6,228,436 B1 | 5/2001 | Affinito |
| 6,231,939 B1 | 5/2001 | Shaw et al. |
| 6,264,747 B1 | 7/2001 | Shaw et al. |
| 6,268,695 B1 | 7/2001 | Affinito |
| 6,274,204 B1 | 8/2001 | Affinito |
| 6,322,860 B1 | 11/2001 | Stein et al. |
| 6,333,065 B1 | 12/2001 | Arai et al. |
| 6,348,237 B2 | 2/2002 | Kohler et al. |

(56) References Cited

U.S. PATENT DOCUMENTS

| | | |
|---|---|---|
| 6,350,034 B1 | 2/2002 | Fleming et al. |
| 6,352,777 B1 | 3/2002 | Bulovic et al. |
| 6,358,570 B1 | 3/2002 | Affinito |
| 6,361,885 B1 | 3/2002 | Chou |
| 6,397,776 B1 | 6/2002 | Yang et al. |
| 6,413,645 B1 | 7/2002 | Graff et al. |
| 6,416,872 B1 | 7/2002 | Maschwitz |
| 6,420,003 B2 | 7/2002 | Shaw et al. |
| 6,436,544 B1 | 8/2002 | Veyrat et al. |
| 6,460,369 B2 | 10/2002 | Hosokawa |
| 6,465,953 B1 | 10/2002 | Duggal |
| 6,468,595 B1 | 10/2002 | Mikhael et al. |
| 6,469,437 B1 | 10/2002 | Parthasarathy et al. |
| 6,469,438 B2 | 10/2002 | Fukuoka et al. |
| 6,492,026 B1 | 12/2002 | Graff et al. |
| 6,497,598 B2 | 12/2002 | Affinito |
| 6,497,924 B2 | 12/2002 | Affinito et al. |
| 6,509,065 B2 | 1/2003 | Affinito |
| 6,512,561 B1 | 1/2003 | Terashita et al. |
| 6,522,067 B1 | 2/2003 | Graff et al. |
| 6,537,688 B2 | 3/2003 | Silvernail et al. |
| 6,544,600 B2 | 4/2003 | Affinito et al. |
| 6,569,515 B2 | 5/2003 | Hebrink et al. |
| 6,570,325 B2 | 5/2003 | Graff et al. |
| 6,573,652 B1 | 6/2003 | Graff et al. |
| 6,576,351 B2 | 6/2003 | Silvernail |
| 6,592,969 B1 | 7/2003 | Burroughes et al. |
| 6,597,111 B2 | 7/2003 | Silvernail et al. |
| 6,613,395 B2 | 9/2003 | Affinito et al. |
| 6,614,057 B2 | 9/2003 | Silvernail et al. |
| 6,624,568 B2 | 9/2003 | Silvernail |
| 6,627,267 B2 | 9/2003 | Affinito |
| 6,628,071 B1 | 9/2003 | Su |
| 6,653,780 B2 | 11/2003 | Sugimoto et al. |
| 6,656,537 B2 | 12/2003 | Affinito et al. |
| 6,664,137 B2 | 12/2003 | Weaver |
| 6,681,716 B2 | 1/2004 | Schaepkens |
| 6,703,780 B2 | 3/2004 | Shiang et al. |
| 6,710,542 B2 | 3/2004 | Chun et al. |
| 6,734,625 B2 | 5/2004 | Vong et al. |
| 6,737,753 B2 | 5/2004 | Kumar et al. |
| 6,743,524 B2 | 6/2004 | Schaepkens |
| 6,749,940 B1 | 6/2004 | Terasaki et al. |
| 6,765,351 B2 | 7/2004 | Forrest et al. |
| 6,777,871 B2 | 8/2004 | Duggal et al. |
| 6,803,245 B2 | 10/2004 | Auch et al. |
| 6,811,829 B2 | 11/2004 | Affinito et al. |
| 6,815,887 B2 | 11/2004 | Lee et al. |
| 6,818,291 B2 | 11/2004 | Funkenbusch et al. |
| 6,822,391 B2 | 11/2004 | Yamazaki et al. |
| 6,827,788 B2 | 12/2004 | Takahashi |
| 6,835,950 B2 | 12/2004 | Brown et al. |
| 6,836,070 B2 | 12/2004 | Chung et al. |
| 6,837,950 B1 | 1/2005 | Berard |
| 6,852,356 B2 | 2/2005 | Nishikawa |
| 6,864,629 B2 | 3/2005 | Miyaguchi et al. |
| 6,866,901 B2 | 3/2005 | Burrows et al. |
| 6,867,539 B1 | 3/2005 | McCormick et al. |
| 6,872,114 B2 | 3/2005 | Chung et al. |
| 6,872,248 B2 | 3/2005 | Mizutani et al. |
| 6,872,428 B2 | 3/2005 | Yang et al. |
| 6,878,467 B2 | 4/2005 | Chung et al. |
| 6,888,305 B2 | 5/2005 | Weaver |
| 6,888,307 B2 | 5/2005 | Silvernail et al. |
| 6,891,330 B2 | 5/2005 | Duggal et al. |
| 6,897,474 B2 | 5/2005 | Brown et al. |
| 6,897,607 B2 | 5/2005 | Sugimoto et al. |
| 6,905,769 B2 | 6/2005 | Komada |
| 6,911,667 B2 | 6/2005 | Pichler et al. |
| 6,936,131 B2 | 8/2005 | McCormick et al. |
| 6,975,067 B2 | 12/2005 | McCormick et al. |
| 6,998,648 B2 | 2/2006 | Silvernail |
| 7,002,294 B2 | 2/2006 | Forrest et al. |
| 7,012,363 B2 | 3/2006 | Weaver et al. |
| 7,015,640 B2 | 3/2006 | Schaepkens et al. |
| 7,018,713 B2 | 3/2006 | Padiyath et al. |
| 7,029,765 B2 | 4/2006 | Kwong et al. |
| 7,074,501 B2 | 7/2006 | Czeremuszkin et al. |
| 7,112,351 B2 | 9/2006 | Affinito |
| 7,166,007 B2 | 1/2007 | Auch et al. |
| 7,198,832 B2 | 4/2007 | Burrows et al. |
| 7,221,093 B2 | 5/2007 | Auch et al. |
| 7,255,823 B1 | 8/2007 | Guenther et al. |
| 7,298,072 B2 | 11/2007 | Czeremuszkin et al. |
| 7,621,794 B2 | 11/2009 | Lee et al. |
| 2001/0015074 A1 | 8/2001 | Hosokawa |
| 2001/0015620 A1 | 8/2001 | Affinito |
| 2002/0022156 A1 | 2/2002 | Bright |
| 2002/0025444 A1 | 2/2002 | Hebgrink et al. |
| 2002/0068143 A1 | 6/2002 | Silvernail |
| 2002/0069826 A1 | 6/2002 | Hunt et al. |
| 2002/0091174 A1 | 7/2002 | Soane et al. |
| 2002/0102363 A1 | 8/2002 | Affinito et al. |
| 2002/0102818 A1 | 8/2002 | Sandhu et al. |
| 2002/0125822 A1 | 9/2002 | Graff et al. |
| 2002/0139303 A1 | 10/2002 | Yamazaki et al. |
| 2002/0140347 A1 | 10/2002 | Weaver |
| 2003/0038590 A1 | 2/2003 | Silvernail et al. |
| 2003/0085652 A1 | 5/2003 | Weaver |
| 2003/0098647 A1 | 5/2003 | Silvernail et al. |
| 2003/0124392 A1 | 7/2003 | Bright |
| 2003/0127973 A1 | 7/2003 | Weaver et al. |
| 2003/0184222 A1 | 10/2003 | Nilsson et al. |
| 2003/0197197 A1 | 10/2003 | Brown et al. |
| 2003/0199745 A1 | 10/2003 | Burson et al. |
| 2003/0205845 A1 | 11/2003 | Pichler et al. |
| 2003/0218422 A1 | 11/2003 | Park et al. |
| 2003/0235648 A1 | 12/2003 | Affinito et al. |
| 2004/0002729 A1 | 1/2004 | Zamore |
| 2004/0018305 A1 | 1/2004 | Pagano et al. |
| 2004/0029334 A1 | 2/2004 | Bijker et al. |
| 2004/0031442 A1 | 2/2004 | Yamazaki et al. |
| 2004/0046497 A1 | 3/2004 | Schaepkens et al. |
| 2004/0071971 A1 | 4/2004 | Iacovangelo |
| 2004/0113542 A1 | 6/2004 | Hsiao et al. |
| 2004/0115402 A1 | 6/2004 | Schaepkens |
| 2004/0115859 A1 | 6/2004 | Murayama et al. |
| 2004/0119028 A1 | 6/2004 | McCormick et al. |
| 2004/0175512 A1 | 9/2004 | Schaepkens |
| 2004/0175580 A1 | 9/2004 | Schaepkens |
| 2004/0187999 A1 | 9/2004 | Wilkinson et al. |
| 2004/0209090 A1 | 10/2004 | Iwanaga |
| 2004/0212759 A1 | 10/2004 | Hayashi |
| 2004/0219380 A1 | 11/2004 | Naruse et al. |
| 2004/0229051 A1 | 11/2004 | Schaepkens et al. |
| 2004/0241454 A1 | 12/2004 | Shaw et al. |
| 2004/0263038 A1 | 12/2004 | Ribolzi et al. |
| 2005/0003098 A1 | 1/2005 | Kohler et al. |
| 2005/0006786 A1 | 1/2005 | Sawada |
| 2005/0051094 A1 | 3/2005 | Schaepkens et al. |
| 2005/0079295 A1 | 4/2005 | Schaepkens |
| 2005/0079380 A1 | 4/2005 | Iwanaga |
| 2005/0093001 A1 | 5/2005 | Liu et al. |
| 2005/0093437 A1 | 5/2005 | Ouyang |
| 2005/0094394 A1 | 5/2005 | Padiyath et al. |
| 2005/0095422 A1 | 5/2005 | Sager et al. |
| 2005/0095736 A1 | 5/2005 | Padiyath et al. |
| 2005/0112378 A1 | 5/2005 | Naruse et al. |
| 2005/0122039 A1 | 6/2005 | Satani |
| 2005/0129841 A1 | 6/2005 | McCormick et al. |
| 2005/0133781 A1 | 6/2005 | Yan et al. |
| 2005/0140291 A1 | 6/2005 | Hirakata et al. |
| 2005/0146267 A1 | 7/2005 | Lee et al. |
| 2005/0174045 A1 | 8/2005 | Lee et al. |
| 2005/0176181 A1 | 8/2005 | Burrows et al. |
| 2005/0212419 A1 | 9/2005 | Vazan et al. |
| 2005/0224935 A1 | 10/2005 | Schaepkens et al. |
| 2005/0238846 A1 | 10/2005 | Arakatsu et al. |
| 2005/0239294 A1 | 10/2005 | Rosenblum et al. |
| 2006/0003474 A1 | 1/2006 | Tyan et al. |
| 2006/0006799 A1 | 1/2006 | Yamazaki et al. |
| 2006/0028128 A1 | 2/2006 | Ohkubo |
| 2006/0061272 A1 | 3/2006 | McCormick et al. |
| 2006/0062937 A1 | 3/2006 | Padiyath et al. |

(56) References Cited

U.S. PATENT DOCUMENTS

| | | |
|---|---|---|
| 2006/0063015 A1 | 3/2006 | McCormick et al. |
| 2006/0216951 A1 | 9/2006 | Moro et al. |
| 2006/0246811 A1 | 11/2006 | Winters et al. |
| 2006/0250084 A1 | 11/2006 | Cok et al. |
| 2007/0009674 A1 | 1/2007 | Okubo et al. |
| 2007/0033965 A1 | 2/2007 | Lifson et al. |
| 2007/0049155 A1 | 3/2007 | Moro et al. |
| 2007/0164376 A1 | 7/2007 | Burrows et al. |
| 2007/0187759 A1 | 8/2007 | Lee et al. |
| 2008/0032076 A1 | 2/2008 | Dujardin et al. |
| 2009/0258235 A1 | 10/2009 | Tateishi |
| 2010/0193468 A1 | 8/2010 | Burrows et al. |

FOREIGN PATENT DOCUMENTS

| | | |
|---|---|---|
| CN | 1647247 A | 7/2005 |
| DE | 196 03 746 A1 | 4/1997 |
| DE | 696 15 510 T2 | 6/1997 |
| DE | 10 2004 063 619 A1 | 7/2006 |
| EP | 0 147 696 B1 | 7/1985 |
| EP | 0 299 753 A2 | 1/1989 |
| EP | 0 340 935 A2 | 11/1989 |
| EP | 0 390 540 B1 | 10/1990 |
| EP | 0 468 440 A2 | 1/1992 |
| EP | 0 547 550 A1 | 6/1993 |
| EP | 0 590 467 A1 | 4/1994 |
| EP | 0 611 037 A1 | 8/1994 |
| EP | 0 722 787 A2 | 7/1996 |
| EP | 0 777 280 A2 | 6/1997 |
| EP | 0 777 281 A2 | 6/1997 |
| EP | 0 787 824 A2 | 6/1997 |
| EP | 0 787 826 A1 | 6/1997 |
| EP | 0 915 105 A1 | 5/1998 |
| EP | 0 916 394 A2 | 5/1998 |
| EP | 0 931 850 A1 | 7/1999 |
| EP | 0 977 469 A2 | 2/2000 |
| EP | 1021 070 A1 | 7/2000 |
| EP | 1 127 381 | 8/2001 |
| EP | 1 130 420 A2 | 9/2001 |
| EP | 1 278 244 A2 | 1/2003 |
| EP | 1514317 A1 | 3/2005 |
| EP | 1 719 808 A2 | 11/2006 |
| EP | 1 857 270 A1 | 11/2007 |
| GB | 2 210 826 A | 6/1989 |
| JP | S63-96895 | 4/1988 |
| JP | 63136316 | 8/1988 |
| JP | 6418441 | 1/1989 |
| JP | 01041067 | 2/1989 |
| JP | S64-41192 | 2/1989 |
| JP | 02183230 | 7/1990 |
| JP | 3-183759 | 8/1991 |
| JP | 03290375 | 12/1991 |
| JP | 4-14440 | 1/1992 |
| JP | 4-48515 | 2/1992 |
| JP | 04267097 | 9/1992 |
| JP | 06158305 | 11/1992 |
| JP | 5501587 | 3/1993 |
| JP | 5-147678 | 6/1993 |
| JP | 05182759 | 7/1993 |
| JP | 5290972 | 11/1993 |
| JP | 06-136159 | 5/1994 |
| JP | 61-79644 | 6/1994 |
| JP | 06-196260 | 7/1994 |
| JP | 06-223966 | 8/1994 |
| JP | 6234186 A | 8/1994 |
| JP | 07147189 | 6/1995 |
| JP | 07192866 | 7/1995 |
| JP | 8-72188 | 3/1996 |
| JP | 08171988 | 7/1996 |
| JP | 08179292 | 7/1996 |
| JP | 08-203669 | 8/1996 |
| JP | 08325713 | 10/1996 |
| JP | 8-318590 | 12/1996 |
| JP | 09059763 | 4/1997 |
| JP | 09132774 | 5/1997 |
| JP | 09161967 | 6/1997 |
| JP | 9-201897 | 8/1997 |
| JP | 10-725 | 1/1998 |
| JP | 10-013083 | 1/1998 |
| JP | 10312883 | 11/1998 |
| JP | 11040344 | 2/1999 |
| JP | 11-149826 | 6/1999 |
| JP | 11255923 | 9/1999 |
| JP | 200058258 | 2/2000 |
| JP | 2002-151254 | 5/2002 |
| JP | 2003282239 A | 10/2003 |
| JP | 2004-176111 A | 6/2004 |
| JP | 2004-294601 | 10/2004 |
| JP | 2004-309932 | 11/2004 |
| JP | 2008-275737 | 11/2008 |
| WO | WO 87/07848 | 12/1987 |
| WO | WO 89/00337 | 1/1989 |
| WO | 91/07519 A1 | 5/1991 |
| WO | WO 95/10117 | 4/1995 |
| WO | WO 96/23217 | 8/1996 |
| WO | WO 97/04885 | 2/1997 |
| WO | WO 97/16053 | 5/1997 |
| WO | WO 97/22631 | 6/1997 |
| WO | WO 98/10116 | 3/1998 |
| WO | WO 98/18852 | 5/1998 |
| WO | WO 99/16557 | 4/1999 |
| WO | WO 99/16931 | 4/1999 |
| WO | 99/33651 A1 | 7/1999 |
| WO | WO 99/46120 | 9/1999 |
| WO | WO 00/26973 | 5/2000 |
| WO | WO 00/35603 | 6/2000 |
| WO | WO 00/35604 | 6/2000 |
| WO | WO 00/35993 | 6/2000 |
| WO | WO 00/36661 | 6/2000 |
| WO | WO 00/36665 | 6/2000 |
| WO | WO 01/68360 | 9/2001 |
| WO | WO 01/81649 A1 | 11/2001 |
| WO | WO 01/82336 A2 | 11/2001 |
| WO | WO 01/82389 A1 | 11/2001 |
| WO | WO 01/87825 A1 | 11/2001 |
| WO | WO 01/89006 A1 | 11/2001 |
| WO | WO 02/26973 A1 | 4/2002 |
| WO | 02/051626 A1 | 7/2002 |
| WO | 02071506 A1 | 9/2002 |
| WO | WO 03/016589 A1 | 2/2003 |
| WO | WO 03/098716 A1 | 11/2003 |
| WO | WO 03/098716 A1 | 11/2003 |
| WO | WO 2004/006199 A3 | 1/2004 |
| WO | WO 2004/016992 A1 | 2/2004 |
| WO | WO 2004/070840 A1 | 8/2004 |
| WO | WO 2004/089620 A2 | 10/2004 |
| WO | 2004112165 A | 12/2004 |
| WO | WO 2005/015655 A1 | 2/2005 |
| WO | WO 2005/045947 A2 | 5/2005 |
| WO | WO 2005/048368 A1 | 5/2005 |
| WO | WO 2006/036492 A1 | 4/2006 |
| WO | 2006/093898 A1 | 9/2006 |
| WO | 2008097297 A2 | 8/2008 |
| WO | 2008097297 A3 | 8/2008 |
| WO | 2008097297 A9 | 8/2008 |
| WO | 2008/144080 A1 | 11/2008 |

OTHER PUBLICATIONS

Wong, C.P.; Recent Advances in IC Passivation and Encapsulation: Process Techniques and Materials; Polymers for Electronic and Photonic Applications; AT&T bell Laboratories; 1993; pp. 167-209.

Shi, M.K., et al., In-situ and real-time monitoring of plasma-induced etching PET and acrylic films, Plasma and Polymers, Dec. 1999, 4(4), pp. 1-25.

Affinito, J.D. et al.; Vacuum Deposited Polymer/Metal Multilayer Films for Optical Applications; Paper No. C1.I3; International Conference on Metallurgical Coatings; Apr. 15-21, 1995; pp. 1-14.

Affinito, J.D. et al., "Vacuum Deposition of Polymer Electrolytes on Flexible Substrates" Proceedings of the Ninth International Conference on Vacuum Web Coating, Nov. 1995, ed R. Bakish, Bakish Press 1995, pp. 20-36.

(56) References Cited

OTHER PUBLICATIONS

PCT International Search Report regarding International application No. PCT/US 99/29853 dated Mar. 3, 2000.
Yializis A., et al., "Ultra High Barrier Films" 43$^{rd}$ Annual Technical Conference Proceedings, Denver, Apr. 15-20, 2000, pp. 404-407.
Henry, B.M. et al., "Microstructural and Gas Barrier Properties of Transparent Aluminum Oxide and Indium Tin Oxide Films" 43$^{rd}$ Annual Technical Conference Proceedings, Denver, Apr. 15-20, 2000, pp. 373-378.
Affinito, J.D. et al.; Vacuum Deposition of Polymer Electrolytes on Flexible Substrates; The Ninth International Conference on Vacuum Web Coating; 1995; pp. 0-16.
Norenberg, H. et al.; Comparative Study of Oxygen Permeation Through Polymers and Gas Barrier Films; 43$^{rd}$ Annual Technical Conference Proceedings; Denver, Apr. 15-20, 2000; pp. 347-351.
Mahon, J.K. et al.; Requirements of Flexible Substrates for Organic Light Emitting Devices in Flat Panel Display Applications; Society of Vacuum Coaters; 42$^{nd}$ Annual Technical Conference Proceedings; Apr. 1999; pp. 456-459.
Tropsha et al.; Activated Rate Theory Treatment of Oxygen and Water Transport through Silicon Oxide/Poly(ethylene terphthalate) Composite Barrier Structures; J. Phys. Chem B Mar. 1997; pp. 2259-2266.
Tropsha et al.; Combinatorial Barrier Effect of the Multilayer SiOx Coatings on Polymer Substrates; Society of Vacuum Coaters; 40$^{th}$ Annual Technical Conferences Proceedings; Apr. 12-17, 1997; pp. 64-69.
Affinito, J.D. et al.; Ultra High Rate, Wide Area, Plasma Polymerized Films from High Molecular Weight/Low Vapor Pressure Liquid or Solid Monomer Precursors; 45$^{th}$ International Symposium of the American Vacuum Society; Nov. 2-6, 1998; pp. 0-26.
Felts, J.T.; Transparent Barrier Coatings Update: Flexible Substrates; 36$^{th}$ Annual Technical Conference Proceedings; Apr. 25-30, 1993 pp. 324-331.
Affinito, J.D. et al.; Molecularly Doped Polymer Composite Films for Light Emitting Polymer Application Fabricated by the PML Process, 41$^{st}$ Technical Conference of the Society of Vacuum Coaters; Apr. 1998; pp. 220-225.
Affinito, J.D. et al.; Vacuum Deposited Conductive Polymer Films; The Eleventh International Conference on Vacuum Web Coating; Nov. 9-11, 1997; pp. 0-12.
Affinito, J.D. et al.; Polymer/Polymer, Polymer/Oxide, and Polymer/Metal Vacuum Deposited Interferences Filters; Tenth International Vacuum Web Coating Conference; Nov. 1996; pp. 0-14.
Kukla, R. et al.; Transparent Barrier Coatings with EB-Evaporation, an Update; Section Five; Transparent Barrier Coating Papers; Thirteenth International Conference on Vacuum Web Coatings; Oct. 17-19, 1999; pp. 222-233.
Bright, Clark I.; Transparent Barrier Coatings Based on ITO for Flexible Plastic Displays; Thirteenth International Conference on Vacuum Web Coatings; Oct. 17-19, 1999; pp. 247-255.
Henry, B.M. et al.; Microstructural Studies of Transparent Gas Barrier Coatings on Polymer Substrates; Thirteenth International Conference on Vacuum Web Coatings; Oct. 17-19, 1999; pp. 265-273.
Hibino, N. et al.; Transparent Barrier Al$_2$O$_3$ Coating by Activated Reactive Evaporation; Thirteenth International Conference on Vacuum Web Coatings; Oct. 17-19, 1999; pp. 234-245.
Shi, M.K. et al.; Plasma treatment of PET and acrylic coating surfaces-I. In situ XPS measurements; Journal of Adhesion Science and Technology; Mar. 2000, 14(12); pp. 1-28.
Affinito, J.D. et al.; "PML/Oxide/PML Barrier Layer Performance Differences Arising From Use of UV or Electron Beam Polymerization of the PML Layers;" SVC 40$^{th}$ Annual Technical Conference; Apr. 12-17, 1997; pp. 19-25.
Yializis, A. et al.; High Oxygen Barrier Polypropylene Films Using Transparent Acrylate-A$_2$O$_3$ and Opaque Al-Acrylate Coatings; 1995; pp. 95-102; Society of Vacuum Coaters.
Shaw, D.G. et al.; Use of Vapor Deposited Acrylate Coatings to Improve the Barrier Properties of Metallized Film; 1994; pp. 240-244; Society of Vacuum Coaters.

Affinito, J.D. et al.; "Vacuum Deposited Conductive Polymer Films" The Eleventh International Conference on Vacuum Web Coating, no earlier than Feb. 1998, pp. 200-213.
Bunshah, R.F. et al.; "Deposition Technologies for Films and Coatings" Noyes Publications, Park Ridge, New Jersey, 1982, p. 339.
Affinito, J.D.; Energy Res. Abstr. 18(6), #17171, 1993.
Atsuhisa Inoue, Maariko Ishino, Yoshiro Akagi and Yoshiharu Nakajima, Fabrication of a Thin Film of MNA by Vapour Deposition, Proc. of the 33rd Japan Conf. on Materials Research, U.33, p. 177-179, 1990.
Affinito, J.D. et al; Ultrahigh Rate, Wide Area, Plasma Polymerized Films from High Molecular Weight/Low Vapor Pressure Liquid or Solid Monomer Precursors; Journal Vacuum Science Technology A 17(4); Jul./Aug. 1999; pp. 1974-1982; American Vacuum Society.
Graupner, W. et al.; "High Resolution Color Organic Light Emitting Diode Microdisplay Fabrication Method", SPIE Proceedings; Nov. 6, 2000; pp. 11-19.
Czeremuszkin, G. et al.; Permeation Through Defects in Transparent Barrier Coated Plastic Films; 43$^{rd}$ Annual Technical Conference Proceedings; Apr. 15, 2000; pp. 408-413.
Vossen, J.L. et al.; Thin Film Processes; Academic Press, 1978, Part II, Chapter 11-1, Glow Discharge Sputter Deposition, pp. 12-63; Part IV, Chapter IV-1 Plasma Deposition of Inorganic Compounds and Chapter IV-2 Glow Discharge Polymerization, pp. 335-397.
G. Gustafason, et al.; Flexible light-emitting diodes made from soluble conducting polymers; Letters to Nature; Vo. 357; Jun. 11, 1992; pp. 477-479.
F.M. Penning; Electrical Discharges in Gases; 1965; pp. 1-51; Gordon and Breach, Science Publishers, New York—London—Paris.
Affinito, J.D., et al.; High Rate Vacuum Deposition of Polymer Electrolytes; Journal Vacuum Science Technology A 14(3), May/Jun. 1996.
Phillips, R.W.; Evaporated Dielectric Colorless Films on PET and OPP Exhibiting High Barriers Toward Moisture and Oxygen; Society of Vacuum Coaters; 36$^{th}$ Annual Technical Conference Proceedings; 1993; pp. 293-301.
Yamada Y. et al.; The Properties of a New Transparent and Colorless Barrier Film; 1995; pp. 28-31; Society of Vacuum Coaters.
Chahroudi, D.; Transparent Glass Barrier Coatings for flexible Film Packaging; 1991; pp. 130-133; Society of Vacuum Coaters.
Krug, T. et al.; New Developments in Transparent Barrier Coatings; 1993; pp. 302-305; Society Vacuum Coaters.
Affinito, J.D. et al.; A new method for fabricating transparent barrier layers, Thin Solid Films 290-291; 1996; pp. 63-67.
Affinito, J.D. et al.; Polymer-Oxide Transparent Barrier Layers; SVC 39th Annual Technical Conference; Vacuum Web Coating Session; 1996; pp. 392-397.
Hoffman, G. et al.; Transparent Barrier Coatings by Reactive Evaporation; 1994; pp. 155-160; Society of Vacuum Coaters.
Kelmberg-Sapieha, J.E. et al.; Transparent Gas Barrier Coatings Produced by Dual-Frequency PECVD; 1993; pp. 445-449; Society of Vacuum Coaters.
Finson, E. et al.; Transparent SiO$_2$ Barrier Coatings: Conversion of Production Status; 1994; pp. 139-143; Society of Vacuum Coaters.
Affinito, J.D. et al; Ultra High Rate, Wide Area, Plasma Polymerized Films from High Molecular Weight/Low Vapor Pressure Liquid or Liquid/Solid Suspension Monomer Precursors; MRS Conference; Nov. 29, 1998-Dec. 3, 1998; Paper No. Y12.1.
Chwang et al, "Thin film encapsulated flexible organic electroluminescent displays" Applied Physics Letters, vol. 83, No. 3, Jul. 21, 2003, pp. 413-415.
Akedo et al, "Plasma-CVD SiNx/Plasma-Polymerized CNx:H Multi-layer Passivation Films for Organic Light Emitting Diodes" Society of Information Display Digest of Technical Papers, vol. 34, No. 1, May 1, 2003, pp. 559-561.
U.S. Office Action dated Sep. 28, 2010 pertaining to U.S. Appl. No. 12/341,134.
Office Action pertaining to U.S. Appl. No. 12/758,244 dated Jun. 7, 2011.
Office Action pertaining to U.S. Appl. No. 12/758,244 dated Jan. 20, 2011.

(56) References Cited

OTHER PUBLICATIONS

Young-Gu Lee et al., Thin Film Encapsulation of AMOLED Displays with Polyurea/Al203 Hybrid Multi-Layers, Reformable Display Group, Samsung Electronics, Paper, pp. 1457-1459.
Office Action dated Aug. 12, 2010 pertains to U.S. Appl. No. 12/758,244.
European Examination Report dated Mar. 25, 2010 pertaining to European Application No. 05 791 757.7.
Chinese Office Action dated Mar. 18, 2010 pertaining to Chinese Appln. No. 200780018584.3.
US Notice of Allowance dated Mar. 22, 2010 pertaining to U.S. Appl. No. 11/509,837.
International Search Report/Written Opinion dated Apr. 1, 2010 pertaining to International Appln. No. PCT/US2009/069788.
US Office Action dated Mar. 18, 2010 pertaining to U.S. Appl. No. 12/345,912.
European Examination Report dated Mar. 5, 2010 pertaining to European Appln. No. 07 865 280.7.
US Office Action dated Apr. 29, 2010 pertaining to U.S. Appl. No. 11/068,356.
International Search Report and Written Opinion pertaining to International application No. PCT/US2009/060437 dated Feb. 17, 2010.
International Search Report and Written Opinion pertaining to International application No. PCT/US2009/066518 dated Feb. 15, 2010.
Japanese Office Action pertaining to Japanese Patent Application No. 2003-586919 dated Dec. 16, 2009.
Chinese Office Action pertaining to Chinese Patent Application No. 200580049572.8 dated Jan. 8, 2010.
Notice of Allowance pertaining to U.S. Appl. No. 11/693,022 dated Jan. 28, 2010.
Notice of Allowance dated Dec. 29, 2009 pertaining to U.S. Appl. No. 11/693,022.
Advisory Action dated Dec. 15, 2009 pertaining to U.S. Appl. No. 11/693,020.
Election/Restrictions Requirement dated Dec. 14, 2009 pertaining to U.S. Appl. No. 11/509,837.
Examiners Answer dated Nov. 12, 2009 pertaining to U.S. Appl. No. 10/412,133.
Office Action dated Dec. 7, 2009 pertaining to U.S. Appl. No. 11/068,356.
Office Action dated Dec. 1, 2009 pertaining to U.S. Appl. No. 11/627,583.
Office Action of U.S. Appl. No. 11/693,020 dated Oct. 29, 2009.
Advisory Action of U.S. Appl. No. 10/412,133 dated Apr. 8, 2008.
Advisory Action of U.S. Appl. No. 10/412,133 dated Aug. 8, 2008.
Advisory Action of U.S. Appl. No. 11/112,880 dated Jul. 23, 2009.
Advisory Action of U.S. Appl. No. 11/693,022 dated Oct. 21, 2009.
Election/Restrictions Requirement of U.S. Appl. No. 10/412,133 dated Dec. 28, 2004.
Election/Restrictions Requirement of U.S. Appl. No. 11/112,880 dated Jul. 25, 2008.
Election/Restrictions Requirement of U.S. Appl. No. 11/693,020 dated Aug. 8, 2008.
Election/Restrictions Requirement of U.S. Appl. No. 11/693,022 dated Oct. 7, 2008.
Advisory Action of U.S. Appl. No. 11/068,356 dated Feb. 12, 2008.
Election/Restrictions Requirement of U.S. Appl. No. 11/693,020 dated Jun. 25, 2009.
Election/Restrictions Requirement of U.S. Appl. No. 11/509,837 dated Mar. 4, 2009.
Notice of Allowance of U.S. Appl. No. 11/776,616 dated Sep. 18, 2009.
Office Action of U.S. Appl. No. 11/693,022 dated Jan. 23, 2009.
Office Action of U.S. Appl. No. 10/412,133 dated Mar. 3, 2006.
Office Action of U.S. Appl. No. 10/412,133 dated Mar. 28, 2005.
Office Action of U.S. Appl. No. 11/112,880 dated May 28, 2009.
Advisory Action of U.S. Appl. No. 11/068,356 dated Mar. 30, 2009.
Office Action of U.S. Appl. No. 11/693,022 dated Aug. 18, 2009.
Office Action of U.S. Appl. No. 10/412,133 dated Sep. 5, 2007.
Office Action of U.S. Appl. No. 10/412,133 dated Sep. 7, 2006.
Office Action of U.S. Appl. No. 11/776,616 dated Sep. 26, 2008.
Office Action of U.S. Appl. No. 10/412,133 dated Nov. 3, 2005.
Office Action of U.S. Appl. No. 11/112,880 dated Dec. 3, 2008.
Office Action of U.S. Appl. No. 10/412,133 dated Dec. 11, 2007.
Office Action of U.S. Appl. No. 11/693,020 dated Dec. 30, 2008.
Election/Restrictions Requirement of U.S. Appl. No. 11/068,356 dated Oct. 17, 2008.
Office Action of U.S. Appl. No. 11/068,356 dated Jan. 22, 2009.
Office Action of U.S. Appl. No. 11/068,356 dated Apr. 4, 2008.
Office Action of U.S. Appl. No. 11/068,356 dated Jun. 10, 2009.
Office Action of U.S. Appl. No. 11/068,356 dated Jun. 15, 2007.
Office Action of U.S. Appl. No. 11/068,356 dated Nov. 28, 2007.
Office Action of U.S. Appl. No. 11/509,837 dated Jun. 30, 2009.
Election/Restrictions Requirement of U.S. Appl. No. 12/345,912 dated Oct. 27, 2009.
"Universal Display Corporation's White OLED Technology Exceeds 100 LM/W—A Major Milestone for Solid-State Lighting", Universal Display Corporation, Jun. 17, 2008, pp. 1-3.
Sun, Yiru et al., "Enhanced light out-coupling of organic light-emitting devices using embedded low-index grids", Letters, Jul. 11, 2008, pp. 1-5.
Lee, Yong-Jae et al., "A high-extraction-efficiency nanopatterned organic light-emitting diode", Applied Physics Letters, vol. 82, No. 21, May 26, 2003, pp. 1-3.
Kamaev, Vladimir et al., "Optical studies of 2D and 3D metallo-dielectric photonic crystals", Plasmonics: Metallic Nanostructures and Their Optical Properties III, Proceedings of SPIE vol. 5927, 2005, pp. 1-13.
Ishibashi, Tadashi et al., "Active Matrix Organic light Emitting Diode Display Based on "Super Top Emission" Technology", Japanese Journal of Applied Physics, vol. 45, No. 5B, 2006, pp. 4392-4395.
Dodabalapur, A. et al., "Color variation with electroluminescent organic semiconductors in multimode resonant cavities" Appl. Phys. Lett. 65 (18), Oct. 31, 1994, pp. 2308-2310.
Tanaka, Daisaku et al., "Ultra High Efficiency Green Organic Light-Emitting Devices", Japanese Journal of Applied Physics, 46 (2007), pp. L10-L12, pp. 1-3.
Lee, Jiun-Haw et al., "Radiation Simulations of Top-Emitting Organic Light-Emitting Devices With Two and Three-Microcavity Structures", Journal of Display Technology, vol. s, No. 2, Jun. 2006, pp. 130-137.

ENCAPSULATED WHITE OLEDS HAVING ENHANCED OPTICAL OUTPUT

This application is a Continuation of U.S. application Ser. No. 12/341,251, filed Dec. 22, 2008, entitled Encapsulated White OLEDs Having Enhanced Optical Output.

The invention relates generally to encapsulated organic light emitting devices (OLEDs), and more particularly to encapsulated white OLEDs having improved light outcoupling compared to the bare OLED.

BACKGROUND OF THE INVENTION

The optimization of the light outcoupling from an OLED is an important factor in the commercialization of OLEDs in many applications.

OLEDs have reached remarkable levels of power efficiencies over the years by lowering the operating voltage and increasing the quantum yield of internal light generation to almost 100% resulting in power efficiencies of more than 120 Lm/Watt for green light (Ultra High Efficiency Green Organic Light-Emitting Devices, Jpn. J. Appl. Phys. 46, p. L10-L12, (2007)) and recently 100 Lm/W for white light (Press Release of Jun. 17, 2008 by Universal Display Corp.).

The high efficiency is a major advantage not only for the use of OLEDs for displays, but also for their use as a light source for signage and general lighting purposes. Nevertheless, the efficiency could be much higher if all the light which is generated within the OLED device were actually being coupled out of the device. Currently, this efficiency is only about 20-25%, due to the planar waveguiding properties of the OLED device.

Efforts have been made to enhance this light out-coupling by putting optical stacks and/or scattering layers on top of the device. However, these methods do not necessarily result in optimized light output.

OLEDs could play an important role as one of the illumination sources for the future because of their high efficiency and their unique ability to form a uniform diffuse emitting surface. Efficiencies of more than 100 Lm/Watt for white light are sought for. Surface areas for these new light sources might be between about 10-100 $cm^2$ to several square meters.

The challenge in creating an OLED emitting white light is not only to create white light efficiently, meaning that the source should contain enough of the red, green, and blue component of the visible spectrum to be perceived as white, but also to create a good 'color rendering,' meaning that all the wavelengths of the visible spectrum should be well represented in the optical output. Ideally, the wavelength distribution would mimic that of black body radiation.

Unlike displays where a sharp emission in the red, green, and blue area of the spectrum is an advantage, the challenge is here is to create a broad emission spectrum covering the whole visible range.

Another desirable feature is that the color point of the light source should not change too much by looking at it at a sharp angle; it should not appear red or blue.

A multilayer minor formed by a quarter-wave stack only enhances one narrow band of wavelengths of light emitted from the OLED. The structure in a quarter wave stack is wavelength dependent, which means that the use of the same structure for red, green, and blue (RGB) applications can be problematic. Also, the number of layers needed for an effective quarter wave (QW) stack can be quite high (e.g., 10 layer pairs or more), which makes it impractical for many commercial applications. Furthermore, the OLED emission is generally broad. In a well designed QW stack, it is possible that a portion of the light will not be transmitted. Another disadvantage of the structure is that the intensity of the light transmitted by a QW stack is strongly directional, and in general the stack is designed with maximum intensity for forward transmission. This feature is generally unfavorable for display applications because it limits the viewing angle and is unacceptable for general applications in solid state lighting (SSL). The implementation of effective QW stacks requires strict control of thickness uniformity ($\Delta t<5$ nm). This is generally achieved with a thin layer (t<20 nm) deposited at relatively low speed. It would become impractical for thick layers (100 nm<t<1000 nm), as for example, the layers required to form an efficient environmental barrier.

Optical cavities (single and multiple) have been suggested to enhance the light output of OLED devices. Similarly to QW stacks, optical cavities are wavelength specific. Therefore, a specific design and its accurate implementation are necessary for each wavelength. The emission from a single optical cavity is very angular dependent. Double or triple cavities must be implemented to make the emission independent from the observation point. The implementation is therefore practically difficult and complex and may require a different sequence of layers as well as different thicknesses of the layers in parts of the device.

Because QW stacks and optical cavities are wavelength specific, they cannot be used with white light sources.

Another problem with using OLEDs in white light sources for general lighting, signage and backlight applications, and in flat panel displays and other information display formats is that they are limited by the poor environmental stability of the devices. G. Gustafson, Y. Cao, G. M. Treacy, F. Klavetter, N. Colaneri, and A. J. Heeger, Nature, Vol. 35, 11 Jun. 1992, pages 477-479. Humidity and oxygen significantly reduce the useful life of most OLEDs. As a result, these devices are typically fabricated on glass substrates with glass covers laminated on top of the OLED with the edges sealed to exclude water and oxygen from the active layers.

Thus, there remains a need for a method of improving the light outcoupling of encapsulated white OLEDs compared to the bare white OLEDs, while protecting the OLED from environmental contaminants.

DESCRIPTION OF THE INVENTION

Figure 1A:
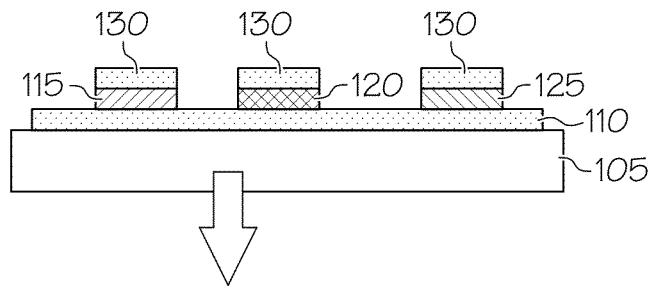
FIGS. 1A-F are schematics showing different types of white OLEDs.

The present invention meets that need by providing a method of making an integrated barrier and optical enhancement stack for protecting and improving the light outcoupling of encapsulated white OLEDs.

The desired features for the white OLED create a challenge for providing an integrated barrier and optical enhancement stack. The barrier and optical enhancement stack should enhance as wide a part of the spectrum as possible and not introduce a strong angular dependence of the emission.

In one embodiment, the method includes providing a co-doped white OLED having a transparent electrode; selecting a plasma protective layer having a refractive index in a range of about 1.1 to about 1.9, the plasma protective layer adjacent to the transparent electrode of the white OLED; and optimizing a thickness of the plasma protective layer for the white OLED, the thickness being in range of about 20 nm to about 50 nm; selecting an initial inorganic barrier layer having a refractive index in a range of about 1.55 to about 2, the initial inorganic barrier layer adjacent to a transparent electrode in the white OLED; optimizing a thickness of the initial inorganic barrier layer for the white OLED, the thickness being in a range of about 40 nm to about 240 nm; selecting a barrier stack comprising an inorganic barrier layer and a polymeric decoupling layer, the inorganic barrier layer having a refractive index in a range of about 1.55 to about 2, and the polymeric decoupling layer having a refractive index in a range of about 1.4 to about 1.65, the barrier stack adjacent to the initial inorganic barrier layer; and optimizing a thickness of the inorganic barrier layer and the polymeric decoupling layer of the barrier stack, the thickness of the inorganic barrier layer being in a range of about 20 nm to about 80 nm, and the thickness of the polymeric decoupling layer being in a range of about 0.2 µm to about 4 µm; wherein the thickness of at least one of the plasma protective layer, initial inorganic barrier layer, the inorganic barrier layer, or the polymeric decoupling layer are optimized for at least one of total efficiency, or intentional color point shift so that the encapsulated white OLED has enhanced light outcoupling compared to a bare white OLED; depositing the plasma protective layer having the optimized thickness adjacent to the transparent electrode of the white OLED; depositing the initial inorganic barrier layer having the optimized thickness adjacent to the plasma protective layer; and depositing the barrier stack having the optimized thickness for the inorganic barrier layer and the polymeric decoupling layer adjacent to the initial inorganic barrier layer.

Another embodiment involves providing a vertically stacked white OLED having a transparent electrode; selecting an initial organic layer having a refractive index in a range of about 1.4 to about 1.65, the initial organic layer adjacent to the transparent electrode of the white OLED; and optimizing a thickness of the initial organic layer for the white OLED, the thickness being in range of about 0.2 µm to about 1 µm; selecting an initial inorganic barrier layer having a refractive index in a range of about 1.55 to about 2, the initial inorganic barrier layer adjacent to a transparent electrode in the white OLED; optimizing a thickness of the initial inorganic barrier layer for the white OLED, the thickness being in a range of about 40 nm to about 240 nm; selecting a barrier stack comprising an inorganic barrier layer and a polymeric decoupling layer, the inorganic barrier layer having a refractive index in a range of about 1.55 to about 2, and the polymeric decoupling layer having a refractive index in a range of about 1.4 to about 1.65, the barrier stack adjacent to the initial inorganic barrier layer; and optimizing a thickness of the inorganic barrier layer and the polymeric decoupling layer of the barrier stack, the thickness of the inorganic barrier layer being in a range of about 20 nm to about 80 nm, and the thickness of the polymeric decoupling layer being in a range of about 0.2 µm to about 4 µm; wherein the thickness of at least one of the initial organic layer, initial inorganic barrier layer, the inorganic barrier layer, or the polymeric decoupling layer are optimized for at least one of total efficiency, or intentional color point shift so that the encapsulated white OLED has enhanced light outcoupling compared to a bare white OLED; depositing the initial organic layer having the optimized thickness adjacent to the transparent electrode of the white OLED; depositing the initial inorganic barrier layer having the optimized thickness adjacent to the plasma protective layer; and depositing the barrier stack having the optimized thickness for the inorganic barrier layer and the polymeric decoupling layer adjacent to the initial inorganic barrier layer.

The optimization can be done without losing the broad band nature of the white light or creating a strong angular dependence of the visible light.

OLED is a generic term for a light emitting device based on organic materials. Suitable organic materials cover a wide range of materials, including polymers, small molecules, or oligomers. The emitting layer can also include inorganic quantum dots in a device made with organic layers, or quantum dots embedded in an organic layer. Depending on the organic emissive layer being used, the emission of the OLED can vary in color. By 'OLED,' we mean the entire emitting structure which can include one, two, three, or more organic materials which generate different colors.

White OLEDs can be produced by different strategies of color mixing. The strategies include, but are not limited to, horizontal arrays of red, green, and blue (RGB) pixels, co-doping in the same emitting layer, vertical stacks of emitting layers, or vertical stacks of emitting units divided by a charge generation layer (e.g., indium tin oxide (ITO)), so called tandem cells (although more stacks can be used).

FIG. 1A shows a bottom emitting horizontal array of RGB pixels. There is a transparent substrate 105, and a transparent electrode 110. There are red pixels 115, green pixels 120, and blue pixels 125. There are electrodes 130 on each pixel.

Figure 1B:
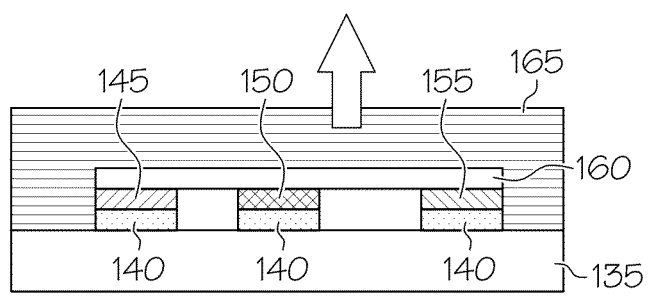

FIG. 1B shows a top emitting horizontal array of RGB pixels. There is a substrate 135, and an electrode 140. There are red pixels 145, green pixels 150, and blue pixels 155. There is a transparent electrode 160 over the pixels, and a transparent multilayer barrier coating 165 over the transparent electrode.

Figure 1C:
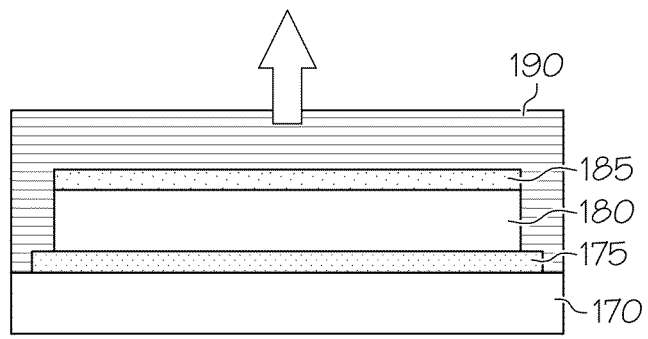

FIG. 1C shows a co-doped white OLED. It includes a substrate 170, a reflective anode or cathode 175, a white emitting co-doped OLED layer 180, a transparent anode or cathode 185, and a transparent multilayer barrier coating 190.

Figure 1D:
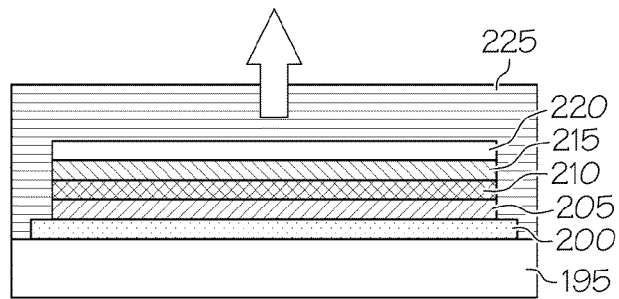
Figure 1E:
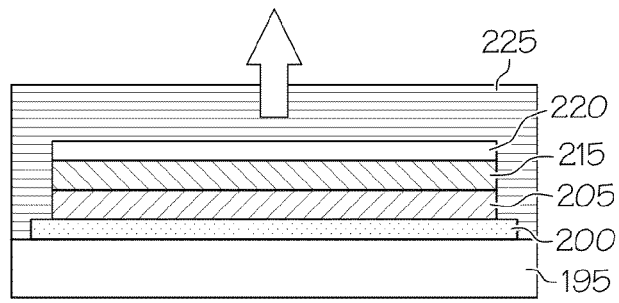

FIGS. 1D and E show vertically stacked RGB OLEDs. They include a substrate 195, and an electrode 200. On top of the electrode 200 in FIG. 1D, there are a blue emitting layer 205, a green emitting layer 210, and a red emitting layer 215. There is a transparent electrode 220 over the emitting layers, and a transparent multilayer barrier coating 225. FIG. 1E has a blue emitting layer 205 and a red emitting layer 215.

Figure 1F:
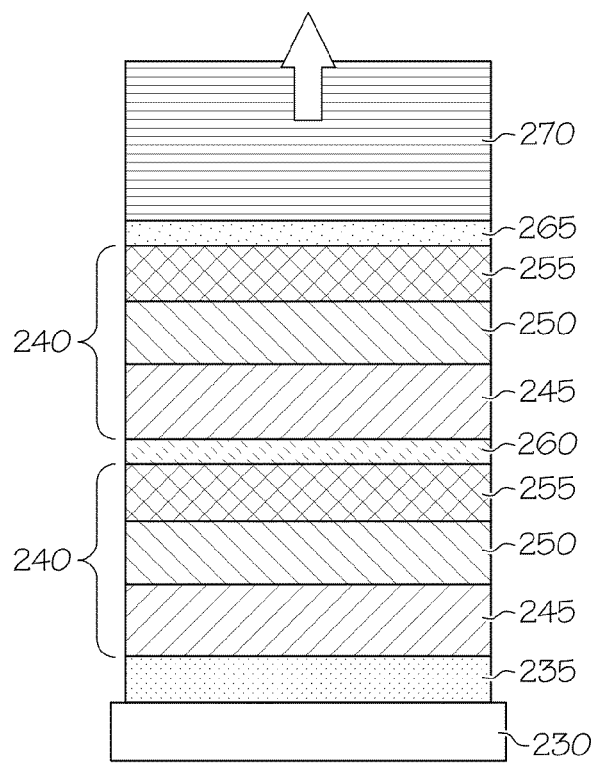

FIG. 1F shows vertical stacks of emitting units divided by a charge generation layer. There is a substrate 230 with an electrode 235. There are two sets 240 of a hole transport layer 245, and electroluminescent layer 250, and an electron transport layer 255 separated by a dielectric layer or ITO layer 260. On top of the second set of layers, there is transparent electrode 265, and a transparent multilayer barrier coating 270.

In this application, we will not describe the strategy for generating white light using horizontally aligned red, green, and blue pixels or red, green, and blue color stripes. This approach is covered by U.S. Ser. No. 12/341,134, filed on even date herewith.

By 'adjacent,' we mean next to, but not necessarily directly next to. There can be additional layers intervening between the adjacent layers. In the event that additional layers are used between the adjacent layers, those layers should be optimized as part of the structure using the optical simulation as well.

The decoupling layer decouples defects between adjacent layers and/or the substrate. The processes used to deposit the barrier layers tend to reproduce any defects in the layer they are deposited on. Therefore, defects in or on the substrate or previous layer may be replicated in the deposited barrier layer, which can seriously limit the barrier performance of the films. The decoupling layer interrupts the propagation of defects from one layer to the next. This is achieved by reducing the surface imperfections of the substrate or previous layer, so that the subsequently deposited barrier layer or other layer, such as the organic light emitting device, has fewer defects. Thus, the decoupling layer has improved surface planarity compared to the previous layer. In addition, the decoupling layers decouple defects in the barrier layers. The decoupling layer intervenes between barrier layers so that the defects in one layer are not next to the defects in the subsequent layer. This creates a tortuous path for gas diffusion, helping to improve the barrier properties. A decoupling layer which is deposited over the barrier layer may also help to protect the barrier layer from damage during processing or further handling.

The decoupling layers can be deposited using a vacuum process, such as flash evaporation with in situ polymerization under vacuum, or plasma deposition and polymerization, or atmospheric processes, such as spin coating, ink jet printing, screen printing, or spraying. The decoupling layer can be made of any suitable decoupling material, including, but not limited to, organic polymers, inorganic polymers, organometallic polymers, hybrid organic/inorganic polymer systems, and combinations thereof. Organic polymers include, but are not limited to, urethanes, polyamides, polyimides, polybutylenes, isobutylene isoprene, polyolefins, epoxies, parylenes, benzocyclobutadiene, polynorbornenes, polyarylethers, polycarbonates, alkyds, polyaniline, ethylene vinyl acetate, ethylene acrylic acid, and combinations thereof. Inorganic polymers include, but are not limited to, silicones, polyphosphazenes, polysilazanes, polycarbosilanes, polycarboranes, carborane siloxanes, polysilanes, phosphonitriles, sulfur nitride polymers, siloxanes, and combinations thereof. Organometallic polymers include, but are not limited to, organometallic polymers of main group metals, transition metals, and lanthanide/actinide metals, or combinations thereof. Hybrid organic/inorganic polymer systems include, but are not limited to, organically modified silicates, preceramic polymers, polyimide-silica hybrids, (meth)acrylate-silica hybrids, polydimethylsiloxane-silica hybrids, and combinations thereof.

The barrier layers can be deposited using a vacuum process, such as sputtering, chemical vapor deposition (CVD), metalorganic chemical vapor deposition (MOCVD), plasma enhanced chemical vapor deposition (PECVD), evaporation, sublimation, electron cyclotron resonance-plasma enhanced vapor deposition (ECR-PECVD), and combinations thereof. The barrier layers can be made of any suitable barrier material. Suitable inorganic materials based on metals include, but are not limited to, individual metals, two or more metals as mixtures, inter-metallics or alloys, metal and mixed metal oxides, metal and mixed metal fluorides, metal and mixed metal nitrides, metal and mixed metal carbides, metal and mixed metal carbonitrides, metal and mixed metal oxynitrides, metal and mixed metal borides, metal and mixed metal oxyborides, metal and mixed metal silicides, or combinations thereof. Metals include, but are not limited to, transition ("d" block) metals, lanthanide ("f" block) metals, aluminum, indium, germanium, tin, antimony and bismuth, and combinations thereof. Many of the resultant metal based materials will be conductors or semiconductors. The fluorides and oxides will include dielectrics (insulators), semiconductors and metallic conductors. Non-limiting examples of conductive oxides include aluminum doped zinc oxide, indium tin oxide (ITO), antimony tin oxide, titanium oxides ($TiO_x$ where $0.8 \leq x \leq 1$) and tungsten oxides ($WO_x$ where $2.7 \leq x < 3.0$). Suitable inorganic materials based on p block semiconductors and non-metals include, but are not limited to, silicon, silicon compounds, boron, boron compounds, carbon compounds including amorphous carbon and diamond-like carbon, and combinations of. Silicon compounds include, but are not limited to silicon oxides ($SiO_x$ where $1 \leq x \leq 2$), polysilicic acids, alkali and alkaline earth silicates, aluminosilicates ($Al_xSiO_y$), silicon nitrides ($SN_xH_y$ where $0 \leq y < 1$), silicon oxynitrides ($SiN_xO_yH_z$ where $0 \leq z < 1$), silicon carbides ($SiC_xH_y$ where $0 \leq y < 1$), and silicon aluminum oxynitrides (SIALONs). Boron compounds include, but are not limited to, boron carbides, boron nitrides, boron oxynitrides, boron carbonitrides, and combinations thereof with silicon.

Suitable decoupling layers and barrier layers and methods of making them are described in U.S. Pat. No. 6,268,695, entitled "Environmental Barrier Material For Organic Light Emitting Device And Method Of Making," issued Jul. 31, 2001; U.S. Pat. No. 6,522,067, entitled "Environmental Barrier Material For Organic Light Emitting Device And Method Of Making," issued Feb. 18, 2003; U.S. Pat. No. 6,570,325, entitled "Environmental Barrier Material For Organic Light Emitting Device And Method Of Making", issued May 27, 2003; U.S. Pat. No. 6,866,901, entitled "Method for Edge Sealing Barrier Films," issued Mar. 15, 2005; U.S. Pat. No. 7,198,832, entitled "Method for Edge Sealing Barrier Films," issued Apr. 3, 2007; application Ser. No. 11/068,356, entitled "Method for Edge Sealing Barrier Films," filed Feb. 28, 2005; application Ser. No. 11/693,020, entitled "Method for Edge Sealing Barrier Films," filed Mar. 29, 2007; and application Ser. No. 11/693,022, entitled "Method for Edge Sealing Barrier Films," filed Mar. 29, 2007; application Ser. No. 11/776,616, entitled "Multilayer Barrier Stacks and Methods of Making Multilayer Barrier Stacks," filed Jul. 12, 2007; each of which is incorporated herein by reference.

A plasma protective layer (PPL) is a layer which shields the underlying device from exposure to a plasma which might be used to deposit barrier layers, decoupling layers, or both. Suitable plasma protective layers and methods of making them are described in pending application Ser. No. 11/439,474, filed May 23, 2006, entitled "Method of Making an Encapsulated Plasma Sensitive Device," which is incorporated herein by reference.

We propose a simple and cost effective solution for two of the most difficult problems for the OLED device: protection of the device from degradation by moisture and oxygen from the environment and enhancing the optical out-coupling and efficiency. We do this by creating a multilayer barrier structure for encapsulation with a choice of materials and structure for the multilayer barrier structure which yields enhanced optical out-coupling for white light.

An integrated barrier and optical enhancement stack would simplify the white light emitting light source, signaling device, or display backlight device, and reduce manufacturing costs. The problem is far from trivial because the demands on both materials and structure for creating a good barrier are very stringent. In addition, creating an optical enhancement layer also poses very stringent conditions on both the choice of materials and the layer structure. While most classical optical multilayer structures to enhance the light out-coupling of a device work by creating a stack which constitutes an optical cavity, (a ¼ wavelength is a special example) which resonates and enhances one wavelength only while suppressing all other wavelengths of emitted light, the solution proposed here enhances the light in a very broad spectral range. We have found design rules for creating a multilayer stack which meets all of the requirements.

Design rules are disclosed for the creation of an integrated multilayer stack which provides protection for the device from the environment, and which enhances the light out-coupling of the OLED in a wide range of the visible spectrum, so as not to affect the white nature of the light and not to introduce a strong angular dependence of the emission. The stack can be designed such that there is no shift of the white color point, or so that the color point is shifted as was intended for the application.

We have demonstrated that it is possible to design a barrier structure for encapsulated white OLEDs with an enhanced light out coupling compared to the bare white OLED.

As white light should contain the primary colors red, green, and blue, we will discuss the optical enhancement in terms of these three primary colors for the sake of convenience. However, it is well understood that a good white light source contains a wide emission spectrum covering all the wavelengths of the visible spectrum.

By enhanced light output coupling compared to the bare white OLED, we mean enhancing total efficiency, or the intentional shift of the color point.

Total efficiency means the integral of all the emitted light over the visible part of the optical spectrum. By enhancing total efficiency, we mean that the total efficiency is increased at least about 10% compared to the bare white OLED. Desirably, the maximum or total efficiency is increased at least about 15%, or at least about 20%, or at least about 25%, or at least about 30%, or at least about 35%, or at least about 40%, or at least about 45, or at least about 50%, or at least about 55% compared to the bare white OLED.

By intentional color point shift, we mean that the white color point in the color triangle is shifted by at least 0.01 in CIE coordinates compared to the bare white OLED. Color point shift results in a change in the appearance of the white light, for example, making the white look 'warmer' (relatively more red, low color temperature) or 'colder' (relatively more blue, high color temperature). This can be used to fine tune the distribution of intensity over the wavelength range of the OLED to obtain more favorable emission characteristics for a certain type of application. An example of this would be obtaining a specific color temperature where the luminescence spectra of the emitting material used in making the OLED did not have the right color point. Color point can be measured using equipment well known to those of skill in the art, such as EPP2000-CXR SpectroColorimeters Instruments for Color Measurement made by Stellar Net Inc. (http://www.stellarnetus/PopularConfiguration_colorsystems.htm).

Optionally, the cathode can be included in the optimization process. The cathode can be made of conductive oxides, desirably transparent conductive oxides, metallic layers, or nanotubes (RI of about 1.6) (typically, carbon nanotubes). The cathode can be a single layer or a multilayer structure. For example, it could be a single layer of a conductive oxide such as indium tin oxide or a metal such as Ag. Alternatively, it could be a multilayer structure including one or more layers of conductive oxide, metallic layers, or combinations thereof. The cathode layers typically have an RI in the range of about 1.6 to about 2, desirably about 1.8 to about 2. The total thickness of the cathode is typically in the range of about 20 to about 300 nm.

For co-doped OLEDs, the integrated barrier and optical enhancement stack can include a PPL. The PPL can be organic or inorganic. An inorganic PPL will generally have a thickness, t, 20 nm<t<50 nm and refractive index (RI) $1.1<n<1.9$. An organic PPL will generally have a thickness, t, 20 nm<t<50 nm and refractive index (RI) $1.1<n<1.9$. The PPL is desirably inorganic. For a given RI of the PPL, the specific thickness may be chosen optimizing the propagation of the visible electromagnetic waves emitted by the specific OLED (light emitting compound and structure) to achieve enhanced total efficiency (or intentional color point shift).

The integrated barrier and optical enhancement stack for co-doped OLEDs includes an initial inorganic barrier layer with thickness, $t_o$, 40 nm<$t_o$<240 nm, and RI, $n_o$, $1.55<n_o<2$. For a given RI of the initial inorganic barrier layer, the specific thickness may be chosen optimizing the propagation of the visible electromagnetic waves emitted by the specific OLED (light emitting compound and structure) to achieve enhanced total efficiency (or intentional color point shift).

The integrated barrier and optical enhancement stack for co-doped OLEDs includes one or more barrier stacks comprising one or more inorganic barrier layers decoupled by one or more polymeric decoupling layers. The barrier layers typically have a refractive index $n_b$~$n_o$ and a thickness, $t_b$, 20 nm<$t_b$<80 nm. The polymeric decoupling layers typically have a refractive index $n_p$, $1.4<n_p<1.65$, and a thickness $t_p$, 0.2 μm<$t_o$<4 μm. The specific thickness of the layers may be chosen optimizing the propagation of the visible electromagnetic waves emitted by the specific OLED (light emitting compound and structure) for enhanced total efficiency (or intentional color point shift). The number of barrier stacks in the integrated barrier and optical enhancement stack is defined by the barrier specifications required by the considered application.

For vertically stacked OLEDs, the integrated barrier and optical enhancement stack can include an initial organic layer with a thickness $t_o$, 0.2 μm<$t_o$<1 μm $t_o$, 0.2 μm <$t_o$ <1 μm, and a refractive index $1.4<n_p<1.65$. For a given refractive index of the organic layer, the specific thickness may be chosen optimizing the propagation of the visible electromagnetic waves emitted by the specific OLED (light emitting compound and structure) for enhanced total efficiency (or intentional color point shift). Suitable materials for the initial organic layer include, but are not limited to, organic polymers, organometallic polymers, hybrid organic/inorganic polymer systems.

The integrated barrier and optical enhancement stack for vertically stacked OLEDs includes an initial inorganic barrier layer with thickness, $t_o$, 40 nm<$t_o$<240 nm, and RI, $n_o$, $1.55<n_o<2$. For a given RI of the initial inorganic barrier layer, the specific thickness may be chosen optimizing the propagation of the visible electromagnetic waves emitted by the specific OLED (light emitting compound and structure) to achieve enhanced total efficiency (or intentional color point shift).

The integrated barrier and optical enhancement stack for vertically stacked OLEDs includes one or more barrier stacks comprising one or more inorganic barrier layers decoupled by one or more polymeric decoupling layers. The barrier layers typically have a refractive index $n_b \sim n_o$ and a thickness, $t_b$, 20 nm$<t_b<$80 nm. The polymeric decoupling layers typically have a refractive index $n_p$, 1.4$<n_p<$1.65, and a thickness $t_p$, 0.2 µm$<t_o<$4 µm. The specific thickness of the layers may be chosen optimizing the propagation of the visible electromagnetic waves emitted by the specific OLED (light emitting compound and structure) for enhanced total efficiency (or intentional color point shift). The number of stacks in the integrated barrier and optical enhancement stack is defined by the barrier specifications required by the considered application.

The integrated barrier and optical enhancement stack for vertically stacked OLEDs can include a PPL, if desired. The PPL can be organic or inorganic. An inorganic PPL will generally have a thickness, t, 20 nm$<$t$<$50 nm and refractive index (RI) 1.1$<$n$<$1.9. An organic PPL will generally have a thickness, t, 20 nm$<$t$<$50 nm and refractive index (RI) 1.1$<$n$<$1.9. The PPL is desirably inorganic. For a given RI of the PPL, the specific thickness may be chosen optimizing the propagation of the visible electromagnetic waves emitted by the specific OLED (light emitting compound and structure) to achieve enhanced total efficiency (or intentional color point shift).

Using the method of the present invention, it is possible to find multiple satisfactory compromises of the solution listed above such that a display can be created with enhanced light output.

The simulations of the white OLEDs/multilayer integrated barrier and optical enhancement stacks were computed using a computer program developed for Vitex Systems Inc. by the Professor Jiun-Haw Lee research group at Graduate Institute of Electro-Optical Engineering, Graduate Institute of Communication Engineering, and Department of Electrical Engineering, National Taiwan University, Taipei 10617, Taiwan, R.O.C. The main assumptions of the model, the mathematics used, and some results on optimization of top emitting (TE) OLED device are described in "Radiation Simulations of Top-Emitting Organic Light Emitting Devices With Two- Or Three-Microcavity Structures," Journal Of Display Technology, Vol. 2, No. 2, June 2006 p. 130, which is incorporated herein by reference.

The model has been extended to include the barrier layers in the calculations.

Figure 13:
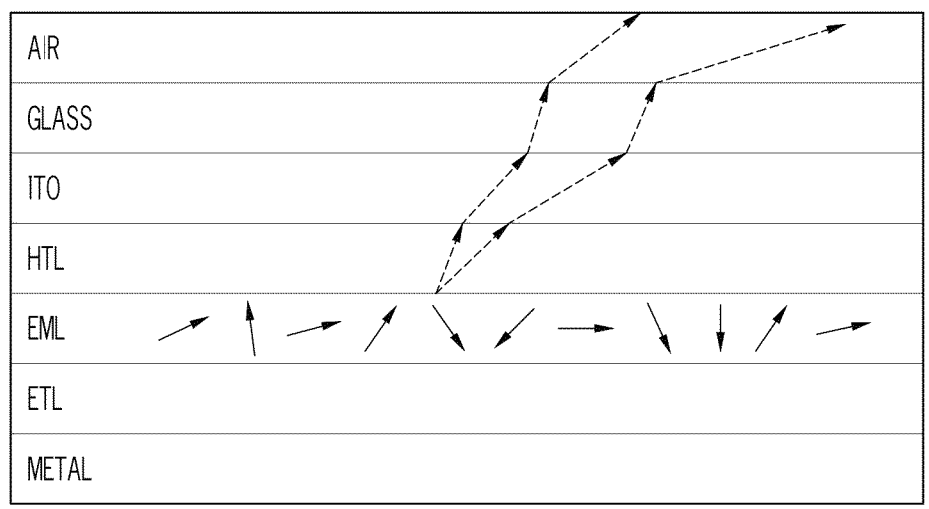
FIG. 13 shows randomly oriented dipoles located in an emission layer of an encapsulated OLED.

The model assumes that the recombination excitons producing the light emitted by the top emitting OLED devices can be represented by a distribution of randomly oriented dipoles located in the emission layer (EML). The emission pattern of the OLED is therefore simulated by simulating the emission pattern of the dipole distribution considering the propagation through the layers of the OLED and the encapsulation, as shown in FIG. 13.

In the theoretical formulation, the model finds the exact classical solution to the problem of the propagation of the electromagnetic field in the multilayer structure by using the Hertzian vector representation of the inhomogenous vector wave equation.

$\vec{\Pi} = \hat{x}\Pi_x + \hat{z}\Pi_z$ is the electric Hertzian vector due to a vertical or horizontal dipole in the emission layer. If $e^{j\omega t}$ describes the time dependence of the electromagnetic field generated by the dipole, the electric field $\vec{E}$ and the magnetic field $\vec{H}$ can be evaluated through the following equations:

$$\vec{E} = \nabla(\nabla \cdot \vec{\Pi}) + k_0^2 n^2 \vec{\Pi}$$

$$\vec{H} = j\omega\epsilon_0 n^2 \nabla \times \vec{\Pi}$$

where $k_0 = \omega\sqrt{\mu_0\epsilon_0} = 2\pi/\lambda$, wavenumber in vacuum. and n (or $n_i$ in the ith layer) is the wavelength-dependent complex refractive index. The solution for the electrical Hertzian potential π can be found solving the following equations:

$$(\nabla^2 + k_0^2 n_e^2)\vec{\Pi}(\vec{r}) = -\frac{\vec{p}\delta(\vec{r})}{\epsilon_0 n_e^2} \quad \text{in emission layer}$$

$$(\nabla^2 + k_0^2 n_i^2)\vec{\Pi}(\vec{r}) = 0 \quad \text{in } i^{th} \text{ layer (non-emission layer)}$$

In this $\vec{p}$ represents a dipole source located at $\vec{r}$, $n_e$ and $n_i$ are the complex refractive index, respectively, of the emission layer and of the other layer in the OLED or encapsulation.

To solve the equations, the cylindrical symmetry properties of the system can be used and the integral expression of the Hertzian vector can be found using the Fourier-Bessel transform in each layer.

$$\tilde{\Pi}(\alpha, z) = \int_0^{2\pi} \Pi(\rho, z) J_0(\alpha\rho) \rho d\rho$$

The unknown coefficients of the expansion can be found considering the boundary conditions that the electric and magnetic fields must be continuous at the interface between layers. By using the calculated coefficients, the integral components of the electromagnetic field can be calculated. Far from the source (i.e., in the far-field) the integration can be done using the saddle method to integrate in the radial direction.

For an emitting layer composed of a large number of randomly oriented dipoles, we can decompose the field in vertical and horizontal dipole components. The total radiation intensity will be therefore given by the addition of the sum of the two horizontal and vertical components.

The emission spectrum and intensity of the emitted light is then calculated considering the transmission and reflection at each layer of the OLED device and of the barrier layer.

In the following simulations, the number of dipoles used as a source has been kept constant so that the comparison between absolute intensity represents a variation given by the OLED or barrier structure.

EXAMPLE 1

Figure 2:
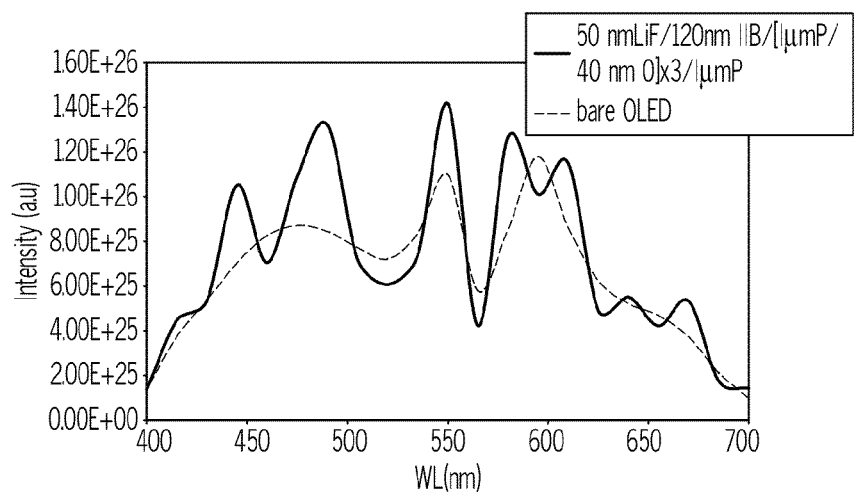
FIG. 2 is a graph showing the effect on intensity and spectral distribution of the emitted light for an encapsulated OLED.

The OLED simulated in FIG. 2 is a vertical RGB with complementary colors with two layers emitting in the red and blue (BAlq and DCJTB). In this case, an optimized integrated barrier and optical enhancement stack is used to create a higher light output. The enhancement of the light output is obtained by a proper choice of the sequence of layers at the interface between the integrated barrier and optical enhancement stack and the OLED.

Integrated barrier and optical enhancement stacks including 50 nm LiF plasma protective layer/120 nm initial inorganic oxide/3 barrier stacks with 1 µm polymeric decoupling layer and 40 nm inorganic oxide layer/1 µm polymeric decoupling layer give light output with spectral distributions similar to that of the unencapsulated OLED and about a 10% enhancement of the integral light output. With a fixed electrical power input, the increase in intensity of the emitted light shows that the efficiency of the light generation has increased.

EXAMPLE 2

Figure 3:
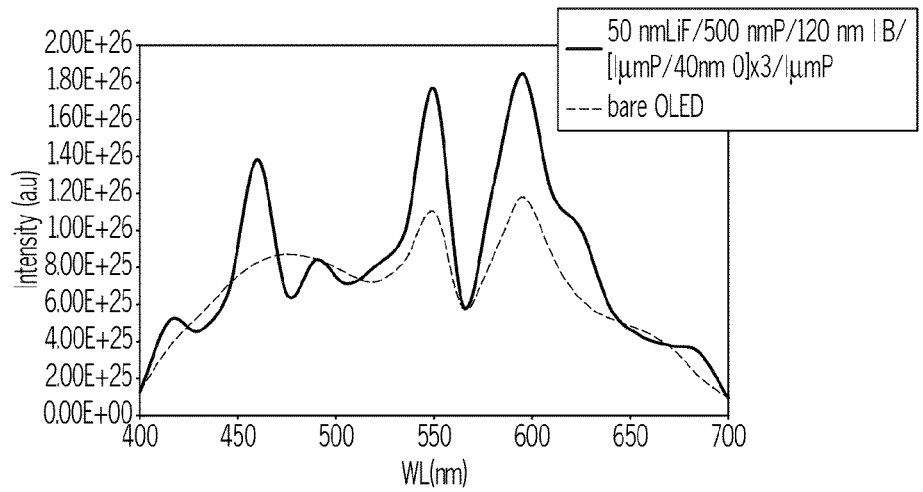
FIG. 3 is a graph showing the effect on intensity and spectral distribution of the emitted light for an encapsulated OLED.

The simulations in FIG. 3 show that substantial enhancement is possible considering integrated barrier and optical enhancement stacks starting (at the interface with the OLED) with an initial organic layer followed by an initial inorganic barrier layer. With this layer sequence at the interface, it is possible to achieve an overall light enhancement ranging from about 110% to about 130% with a spectral distribution similar to that of the bare OLED. In the optimized case shown in FIG. 3, the stack includes 50 nm LiF plasma protective layer/500 nm polymer/120 nm initial inorganic oxide/3 barrier stacks with 1 μm polymeric decoupling layer and 40 nm inorganic oxide layer/1 μm polymeric decoupling layer.

Much greater enhancement is possible when the initial organic layer is the first layer than when the initial inorganic barrier layer is first. (Compare Examples 1 and 2).

EXAMPLE 3

Figure 4:
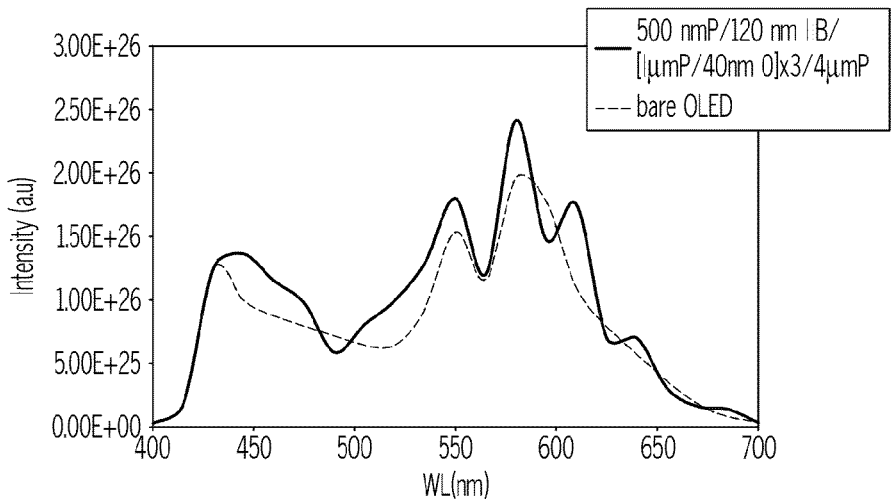
FIG. 4 is a graph showing the effect on intensity and spectral distribution of the emitted light for an encapsulated OLED.

Similar considerations can be extended to stacked emissive units as proposed by Kido (Jing-hua Niu et al., J. Phys. D: Appl. Phys. 38, 1136-1139 (2005)). An example of such a structure is shown in FIG. 1D. In the example shown in FIG. 4, The OLED has a two unit stack (red and blue), and the stack includes 500 nm polymer/120 nm initial inorganic oxide/3 barrier stacks with 1 μm polymeric decoupling layer and 40 nm inorganic oxide layer/1 μm polymeric decoupling layer. It shows a 20% enhancement of the light output compared to the unencapsulated OLED.

EXAMPLE 4

Figure 5:
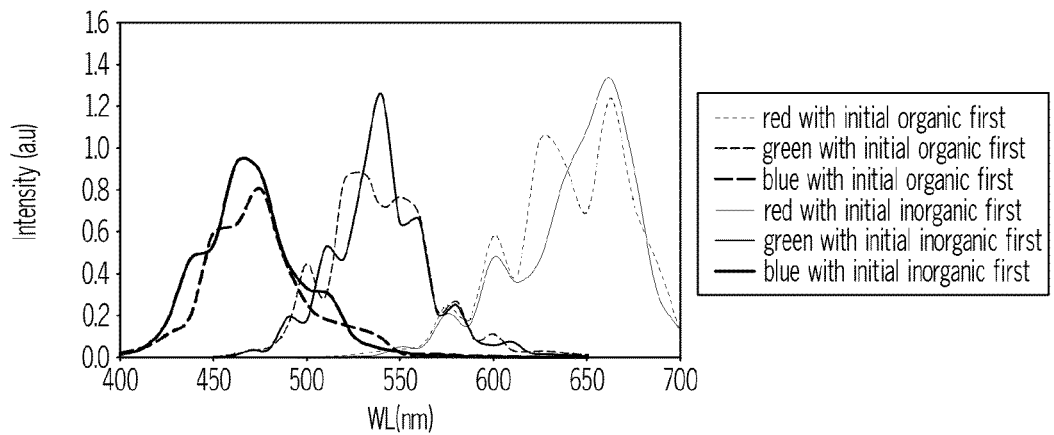
FIG. 5 is a graph showing the effect on intensity and spectral distribution of the emitted light for an encapsulated OLED.

FIG. 5 compares the effect of the first layer being an initial organic layer with the first layer being an initial inorganic barrier layer for an RGB OLED display with a horizontal distribution of monochrome R, G and B pixels. In this case, a barrier and optical enhancement stack which has an initial organic layer first, rather than an initial inorganic barrier layer at the interface, would give reduced intensity. A comparison of FIG. 5 with FIG. 3 clearly shows that the design rules for an optimized integrated barrier and optical enhancement stack are different for a white light source and an RGB OLED display.

EXAMPLE 5

Figure 6:
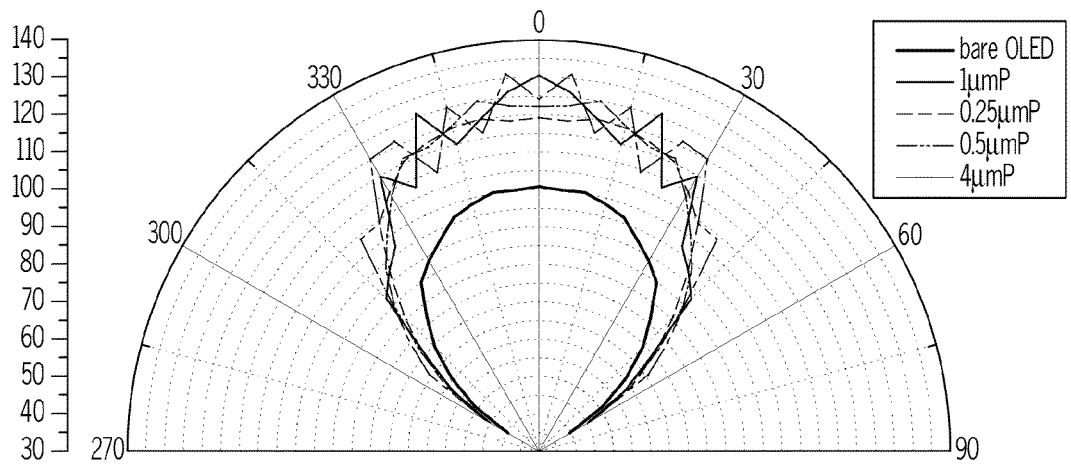
FIG. 6 is a graph showing the integral of the light output for an encapsulated OLED as a function of angle.

As stated before, a desirable feature for a white light source is that the spectral distribution (or color point) is not strongly dependent on the viewing angle. In the following example, it is shown that this indeed the case. The light intensity angular distributions for a vertical white light OLED with complementary colors were simulated. As discussed above in relation to FIG. 3, the OLED structure simulated includes two emitting layers (BAlq and DCJTB). In the simulations shown in FIG. 6, the same barrier structure as in Example 3 is used, but different interlayer polymer thicknesses are compared.

Figure 7:
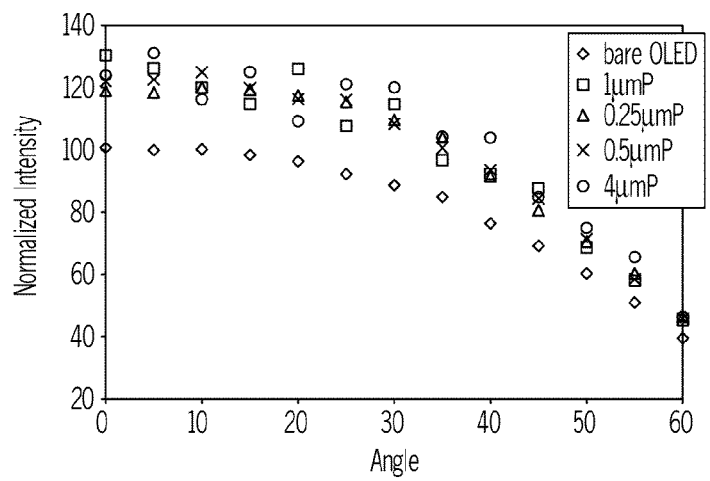
FIG. 7 is a graph showing the effect on intensity and angle for different polymer thicknesses.

The integral of the light output from an encapsulated white light OLED is higher than the corresponding OLED over the angular range 0°-60°. This is true for different thickness of polymer in the stack. Barriers with thicker polymer layers induce more modulation of light output as a function of the observation angle. The integrated intensity for barrier stacks with different polymer thicknesses is shown in FIG. 7 as a function of the observation angle.

Figure 8:
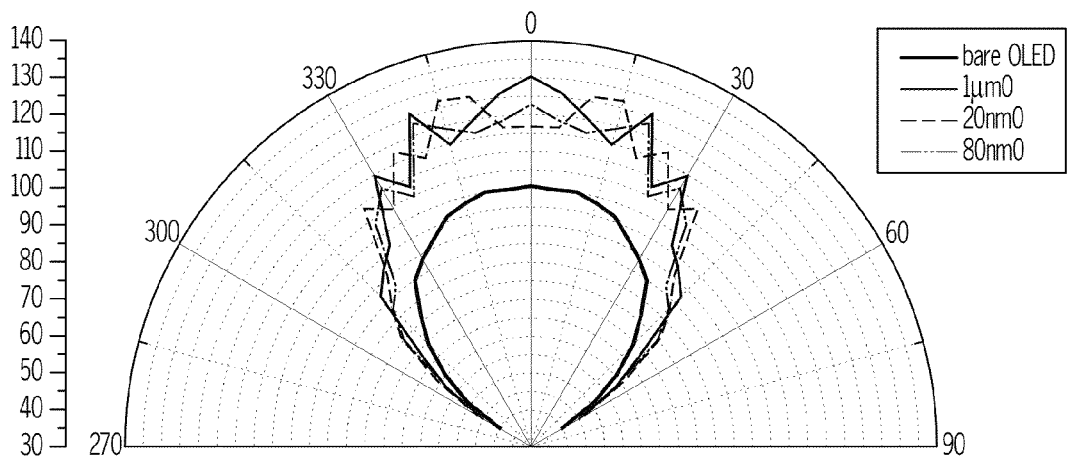
FIG. 8 is a graph showing the integral of the light output for an encapsulated OLED as a function of angle.
Figure 9:
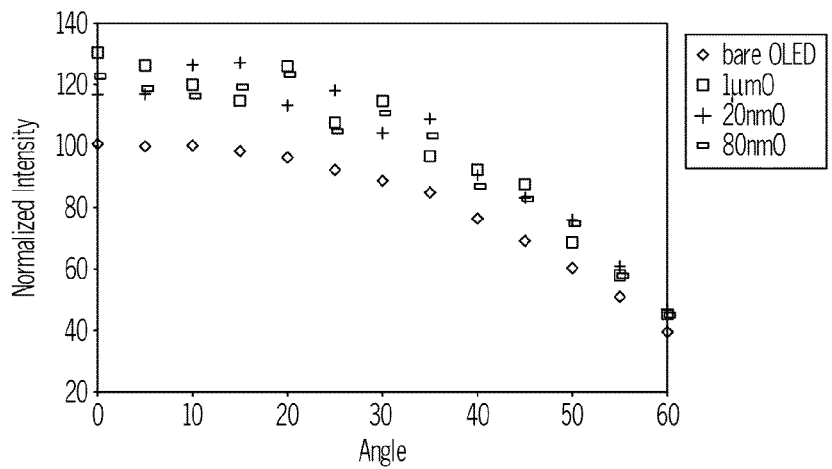
FIG. 9 is a graph showing the effect on intensity and angle for different barrier layer thicknesses.
Figure 10A:
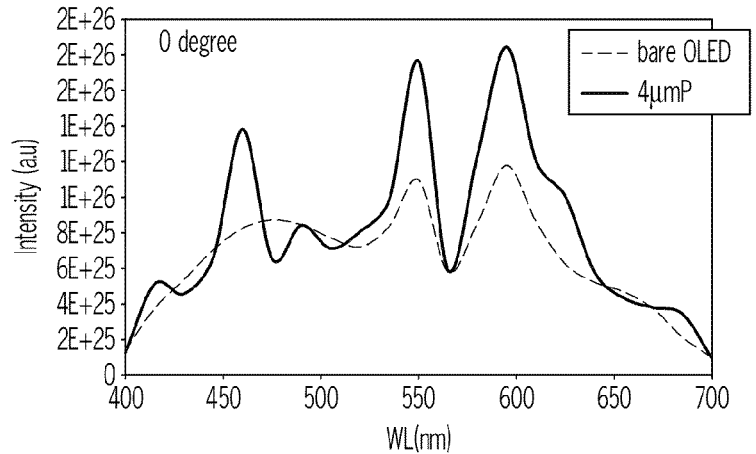
FIGS. 10A-E are graphs showing the spectral distribution of bare and encapsulated OLEDs at different viewing angles.
Figure 10B:
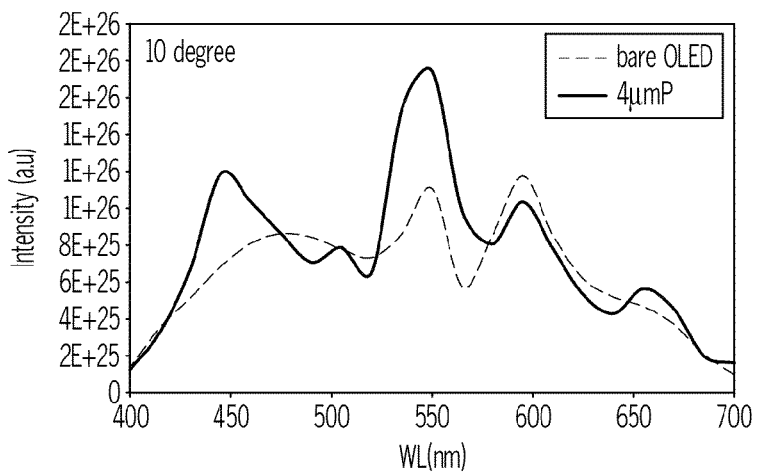
Figure 10C:
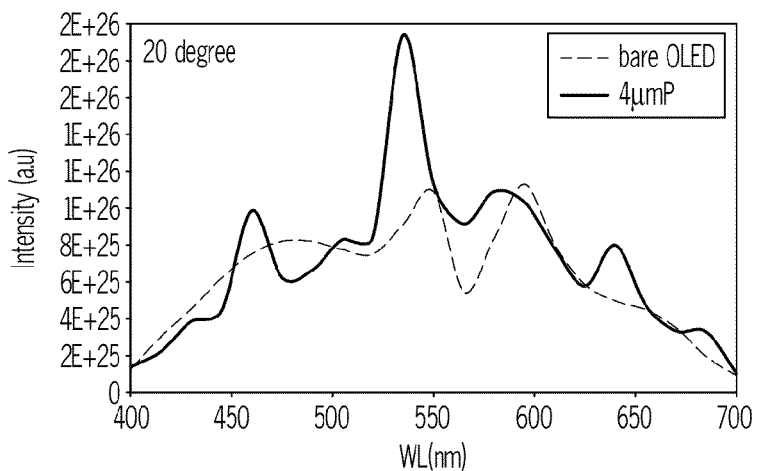
Figure 10D:
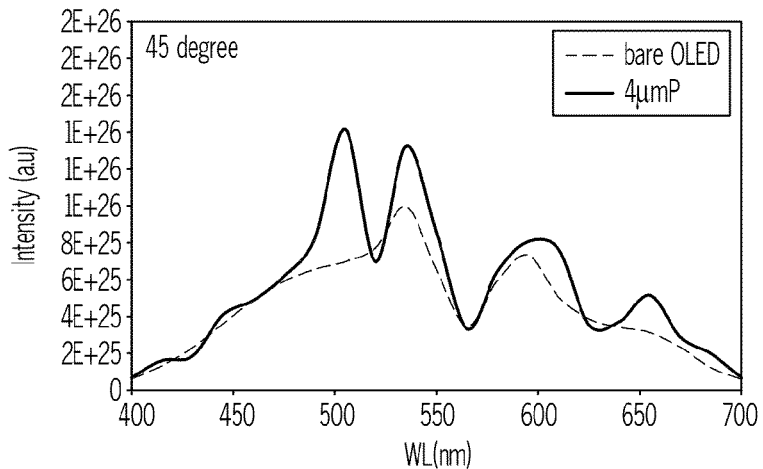
Figure 10E:
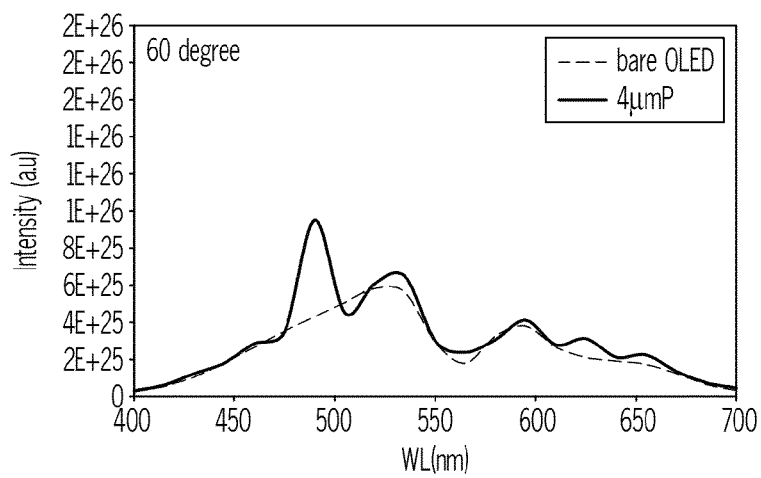
Figure 11A:
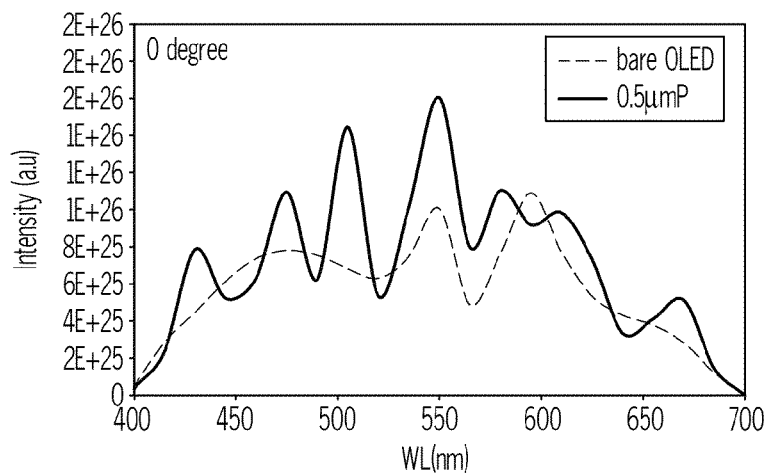
FIGS. 11A-E are graphs showing the spectral distribution of bare and encapsulated OLEDs at different viewing angles.
Figure 11B:
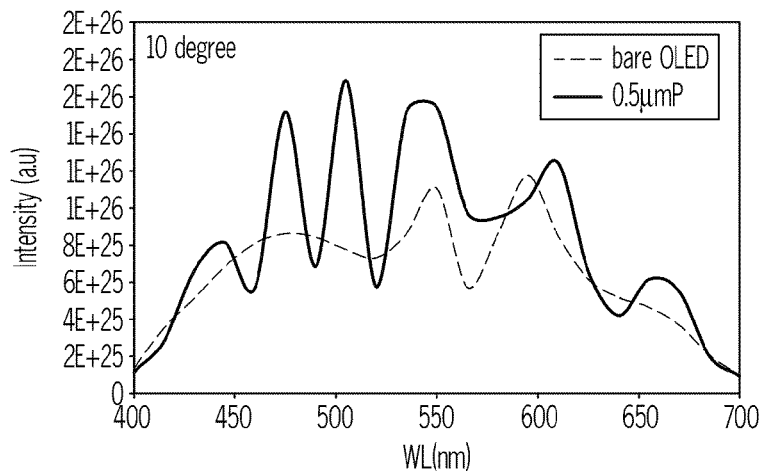
Figure 11C:
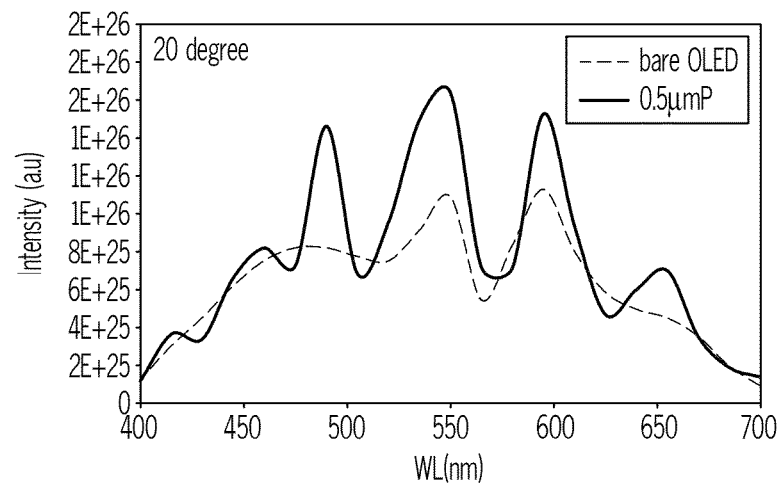
Figure 11D:
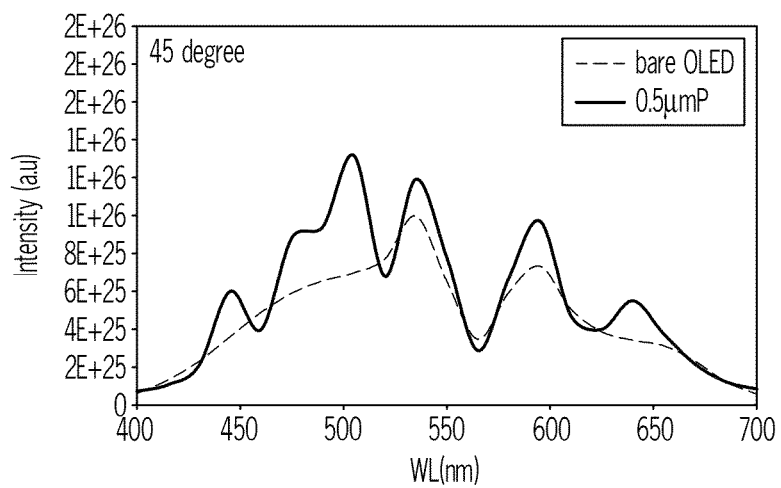
Figure 11E:
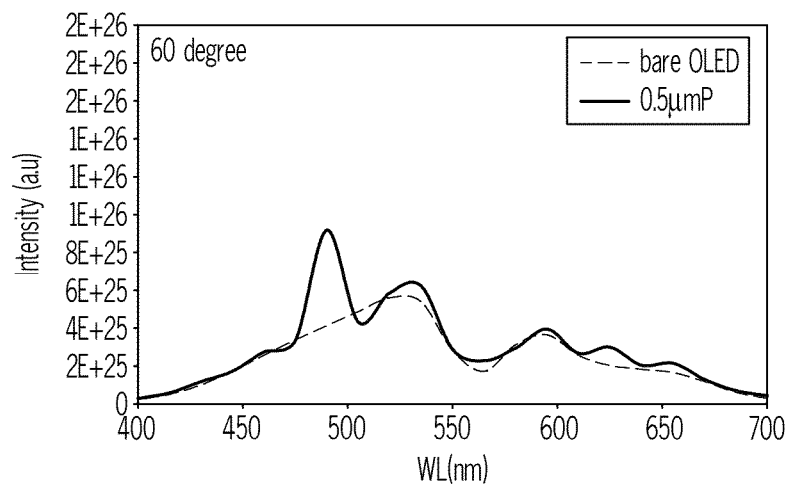

The angular distribution with different interlayer oxide thickness was also simulated. The integral of the light output from an encapsulated white light OLED is higher than the corresponding OLED over the angular range 0°-60°. FIGS. 8-9 show the angular distribution for different thicknesses of oxide in the stack.

The examples show that in both cases the enhancement of the efficiency is obtained for a wide range of viewing angles without strong fluctuations. Enhancing the light mainly in the forward direction (about 0° to about 60°) is advantageous because much sharper viewing angles (about 80° to about 90°) are of not great practical use.

The spectral distribution of the bare and encapsulated OLED changes with viewing angle. For a white light source, the color point should not shift too much with viewing angle. For the encapsulated OLED, the change depends on the polymer thickness in the barrier stack. The evolution of the spectral distributions at selected angles for polymer layer thicknesses of 4 μm and 0.5 μm are shown in FIGS. 10A-E and 11A-E, respectively. It shows that there is no large spectral shift with viewing angle. Only at very wide viewing angles is a small blue shift observed.

EXAMPLE 6

Figure 12:
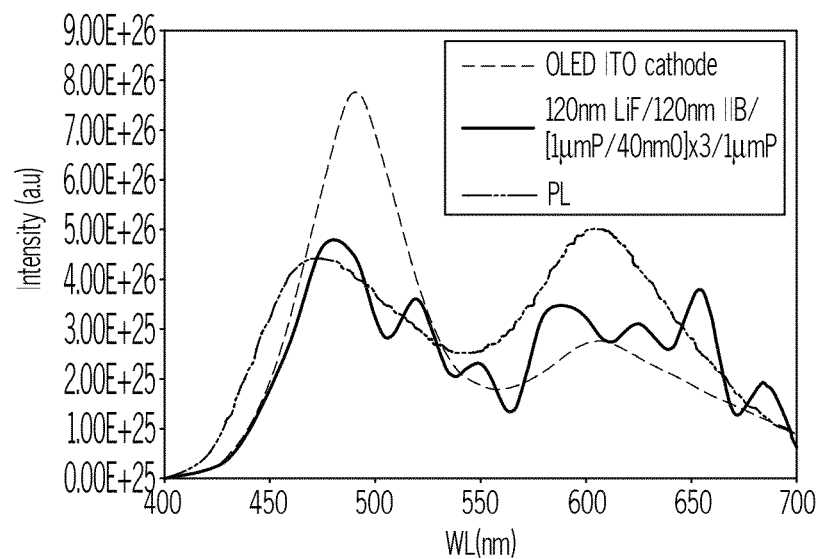
FIG. 12 is a graph showing the effect on intensity and spectral distribution of the emitted light for an encapsulated OLED.

The example in FIG. 12 shows that by selecting a proper integrated barrier and optical enhancement stack it is possible to shift the color point of the white emitting OLED. The emitting layer of the OLED shown in the simulation of FIG. 12 is a co-dopant (BAlq:DCJTB - bis(2-methyl-8-quinolinolato-N1,O8)-(1,1'-biphenyl-4-olato) aluminum: 4-(dicyanomethylene)-2-t-butyl-6 (1,1,7,7-tetramethyljulolidyl-9-enyl)-4 Hpyran)). The scanned photoluminescence (PL) spectrum is shown in FIG. 12. We modified the structure of the bottom emitting OLED used in the literature (Jing-hua Niu et al., "White organic light-emitting diodes based on bis(2-methyl-8-quinolinolato) (para-phenylphenolato)aluminium(III) doped with tiny red dopant", J. Phys. D: Appl. Phys. 38, 1136-1139 (2005)) to obtain a top emitting OLED. To achieve this, we substituted the transparent cathode of the bottom emitting OLED with a reflective cathode, and the reflective anode with a transparent ITO layer. The simulated emission of the resulting OLED is shown in FIG. 12. The intensity of blue emitting range of the spectrum is enhanced, resulting in a white OLED with a 'colder' color point. The structure (LiF, 120 nm/initial inorganic barrier layer, 120 nm/3 barrier stacks with 1 μm polymeric decoupling layer and 40 nm inorganic oxide/1 μm polymeric decoupling layer) was chosen to shift the spectral distribution and make it as similar as possible to the original photoluminescence spectrum and to maintain the original warmer white color. FIG. 12 shows how the spectral distribution of light for the encapsulated OLED is similar to the original distribution with some added modulations. Partial quenching of the red emission is probably due to the slightly incorrect n and k values used in the simulation due to the unavailability of actual experimental values.

Just as it is possible to enhance the optical outcoupling of a top emission OLED using an integrated barrier and optical enhancement stack, it is also possible to enhance the efficiency of bottom emission devices by building them on an integrated barrier and optical enhancement stack. For example, the structure could be: 1) transparent substrate (e.g., glass or plastic); 2) integrated barrier and optical enhancement stack; 3) anode of OLED (e.g., ITO); 4) OLED organic emission layers; and 5) cathode of OLED (e.g., low work function metal combined with aluminum). The same design rules can be applied to this situation. This is a particularly attractive solution when the substrate is a flexible plastic layer so that an efficient flexible display can be made.

As would be understood by those of skill in the art, the integrated barrier and optical enhancement stack would be adjacent to the transparent electrode in the OLED. In a top emitting OLED structure, the transparent electrode would be the cathode, while in a bottom emitting OLED structure, the transparent electrode would be the anode.

While certain representative embodiments and details have been shown for purposes of illustrating the invention, it will be apparent to those skilled in the art that various changes in the compositions and methods disclosed herein may be made without departing from the scope of the invention, which is defined in the appended claims.

What is claimed is:

1. An encapsulated white OLED having an integrated barrier and optical enhancement stack for protecting and improving the light out coupling of the encapsulated white OLED comprising:
   a co-doped white OLED having a transparent electrode;
   a plasma protective layer having a refractive index in a range of about 1.1 to about 1.9 and a thickness within a range of about 20 nm to about 50 nm, the plasma protective layer adjacent to the transparent electrode of the white OLED;
   an initial inorganic barrier layer having a refractive index in a range of about 1.55 to about 2 and a thickness within a range of about 40 nm to about 240 nm, the initial inorganic barrier layer adjacent to the transparent electrode in the white OLED; and
   a barrier stack comprising at least a pair of inorganic barrier layers and a polymeric decoupling layer between the inorganic barrier layers, the inorganic barrier layer having a refractive index in a range of about 1.55 to about 2 and a thickness within a range of about 20 nm to about 80 nm, and the polymeric decoupling layer having a refractive index in a range of about 1.4 to about 1.65 and a thickness within in a range of about 0.2 µm to about 4 µm, the barrier stack adjacent to the initial inorganic barrier layer, wherein the thickness of at least one of the plasma protective layer, initial inorganic barrier layer, the inorganic barrier layer, or the polymeric decoupling layer are optimized for at least one of total efficiency, or intentional color point shift so that the encapsulated white OLED has enhanced light outcoupling compared to a bare white OLED, wherein the initial inorganic barrier layer is different from the inorganic barrier layer of the barrier stack and further wherein the improving the light out coupling of the encapsulated OLED is achieved without either (a) a scattering layer placed adjacent the OLED, initial inorganic barrier layer or barrier stack or (b) a quarter-wave stack placed adjacent the OLED, initial inorganic barrier layer or barrier stack.

2. The encapsulated white OLED of claim 1, wherein the plasma protective layer is an inorganic layer.

3. The encapsulated white OLED of claim 1, wherein the transparent electrode is a transparent cathode.

4. The encapsulated white OLED of claim 3, wherein the co-doped white OLED includes a transparent cathode layer material, the transparent cathode layer material having a refractive index in a range of about 1.6 to about 2 and a thickness within a range of about 20 to about 300 nm, and wherein thickness of the cathode layer is optimized for at least one of total efficiency, or intentional color point shift.

5. The method of claim 1, wherein the transparent electrode in the OLED is a transparent anode.

6. An encapsulated white OLED having an integrated barrier and optical enhancement stack for protecting and improving the light out coupling of the encapsulated white OLED comprising:
   a vertically stacked white OLED having a transparent electrode;
   an initial organic layer having a refractive index in a range of about 1.4 to about 1.65 and a thickness within range of about 0.2 µm to about 1 µm, the initial organic layer adjacent to the transparent electrode of the white electrode;
   an initial inorganic barrier layer having a refractive index in a range of about 1.55 to about 2 and a thickness within a range of about 40 nm to about 240 nm, the initial inorganic barrier layer adjacent to a transparent electrode in the white OLED; and
   a barrier stack comprising at least a pair of inorganic barrier layers and a polymeric decoupling layer between the inorganic barrier layers, the inorganic barrier layer having a refractive index in a range of about 1.55 to about 2 and a thickness within a range of about 20 nm to about 80 nm, and the polymeric decoupling layer having a refractive index in a range of about 1.4 to about 1.65 and a thickness within a range of about 0.2 µm to about 4 µm, the barrier stack adjacent to the initial inorganic barrier layer, wherein the thickness of at least one of the initial organic layer, initial inorganic barrier layer, the inorganic barrier layer, or the polymeric decoupling layer are optimized for at least one of total efficiency, or intentional color point shift so that the encapsulated white OLED has enhanced light outcoupling compared to a bare white OLED, wherein the initial inorganic barrier layer is different from the inorganic barrier layer of the barrier stack and further wherein the improving the light out coupling of the encapsulated OLED is achieved without either (a) a scattering layer placed adjacent the OLED, initial inorganic barrier layer or barrier stack or (b) a quarter-wave stack placed adjacent the OLED, initial inorganic barrier layer or barrier stack.

7. The encapsulated white OLED of claim 6, further comprising a plasma protective layer having a refractive index in a range of about 1.1 to about 1.9 and a thickness within a range of about 20 nm to about 50 nm, the plasma protective layer between the transparent electrode of the white OLED and the initial organic layer, wherein the thickness of the plasma protective layer is optimized for at least one of total efficiency, or intentional color point shift so that the encapsulated white OLED has enhanced light outcoupling compared to the bare white OLED.

8. The method of claim 7, wherein the plasma protective layer is an inorganic layer.

9. The method of claim 6, wherein the transparent electrode is a transparent cathode.

* * * * *